US009948061B2

(12) United States Patent
Njegovec et al.

(10) Patent No.: US 9,948,061 B2
(45) Date of Patent: *Apr. 17, 2018

(54) METHODS OF DRIVING LASER DIODES, OPTICAL WAVELENGTH SWEEPING APPARATUS, AND OPTICAL MEASUREMENT SYSTEMS

(71) Applicant: University of Maribor, Maribor (SI)

(72) Inventors: Matej Njegovec, Topolsica (SI); Denis Donlagic, Maribor (SI)

(73) Assignee: University of Maribor, Maribor (SI)

( * ) Notice: Subject to any disclaimer, the term of this patent is extended or adjusted under 35 U.S.C. 154(b) by 0 days.

This patent is subject to a terminal disclaimer.

(21) Appl. No.: 15/170,576

(22) Filed: Jun. 1, 2016

(65) Prior Publication Data
US 2016/0285235 A1    Sep. 29, 2016

Related U.S. Application Data

(63) Continuation of application No. 13/762,112, filed on Feb. 7, 2013, now Pat. No. 9,373,933.
(Continued)

(51) Int. Cl.
*H01S 3/00* (2006.01)
*H01S 5/06* (2006.01)
(Continued)

(52) U.S. Cl.
CPC ......... *H01S 5/0612* (2013.01); *H01S 5/0622* (2013.01); *H01S 5/06216* (2013.01);
(Continued)

(58) Field of Classification Search
CPC ........ H01S 5/0612; H01S 5/0622; H01S 5/12; H01S 5/06216; H01S 5/227; H01S 5/0021
See application file for complete search history.

(56) References Cited

U.S. PATENT DOCUMENTS

| 4,581,730 A | 4/1986 | Ozeki et al. |
| 5,173,909 A | 12/1992 | Sakano et al. |

(Continued)

OTHER PUBLICATIONS

H. Shalom, et al., "On the Various Time Constants of Wavelength Changes of a DFB Laser Under Direct Modulation", IEEE Journal of Quantum Electronics, IEEE Service Cener, vol. 34, No. 10, (1998) pp. 1817-1821.
(Continued)

*Primary Examiner* — Yuanda Zhang
(74) *Attorney, Agent, or Firm* — Dugan & Dugan, PC

(57) ABSTRACT

An optical wavelength sweeping apparatus is disclosed. The optical wavelength sweeping apparatus includes a laser diode having an active region including a thickness of less than 1 μm, a cross-section of less than 7 μm$^2$, and a ratio of active region volume to total laser diode volume of less than 1/300, and a pulse generator coupled to the laser diode. The pulse generator is configured and operable to provide a current drive pulse to the laser diode to selectively and rapidly heat the active region and immediate vicinity to provide a peak increase in temperature of 30° C. or more at an end of the current pulse and to perform a wavelength sweep of emitted optical radiation which is greater than 5 nm. Methods of driving a laser diode and optical systems are disclosed, as are other aspects.

33 Claims, 19 Drawing Sheets

Related U.S. Application Data

(60) Provisional application No. 61/716,410, filed on Oct. 19, 2012.

(51) Int. Cl.
  *H01S 5/062* (2006.01)
  *H01S 5/12* (2006.01)
  *H01S 5/00* (2006.01)
  *H01S 5/227* (2006.01)

(52) U.S. Cl.
  CPC .............. *H01S 5/12* (2013.01); *H01S 5/0021* (2013.01); *H01S 5/227* (2013.01)

(56) References Cited

U.S. PATENT DOCUMENTS

| | | | |
|---|---|---|---|
| 6,806,114 | B1 | 10/2004 | Lo |
| 6,862,394 | B2 | 3/2005 | Ackerman et al. |
| 7,112,827 | B2 | 9/2006 | Hayakawa et al. |
| 7,212,560 | B2 | 5/2007 | Oh et al. |
| 7,283,243 | B2 | 10/2007 | Langford et al. |
| 2004/0136415 | A1 | 7/2004 | Park et al. |
| 2005/0157303 | A1 | 7/2005 | Langford et al. |
| 2006/0215716 | A1 | 9/2006 | Luo et al. |
| 2008/0319690 | A1* | 12/2008 | Meadows ................ G01K 7/01 702/65 |
| 2010/0020835 | A1* | 1/2010 | Anan .................. H01S 5/18308 372/45.01 |
| 2010/0309937 | A1 | 12/2010 | Ko et al. |
| 2011/0249973 | A1 | 10/2011 | Donlagic et al. |
| 2014/0112361 | A1 | 4/2014 | Njegovec et al. |
| 2016/0025562 | A1 | 1/2016 | Donlagic et al. |

OTHER PUBLICATIONS

Y. Zhang et al., "Pulse Wavelength Scan of Room-Temperature Mid-Infrared Distributed Feedback Quantum Cascade Lasers for N20 Gas Detection", Chinese Physics Letters, Institute of Physics Publishing, Bristol, GB, vol. 23. No. 7, (2006), pp. 1780-1783.

S. Wu et al., "Quantum cascade laser sensors for online gas chromatography", Quantum Sensing Nanophotonic Devices VIII, SPIE, vol. 7945, No. 1, (2011), pp. 1-15.

M. Njegovec et al., "Rapid and broad wavelength sweeping standard telecommunication distributed feedback laser diode", Optics Letters, the Optical Society, vol. 38, No. 11 (2013) pp. 1999-2001.

International Search Report and Written Opinion of related International Application No. PCT/EP2013/071881 (19022P-WO) dated Mar. 4, 2014.

Feb. 29, 2016 Reply to Feb. 26, 2016 Notice to file Corrected Application Papers of U.S. Appl. No. 13/762,112.

Notice to file Corrected Application Papers of U.S. Appl. No. 13/762,112 dated Feb. 26, 2016.

Notice of Allowance of U.S. Appl. No. 13/762,112 dated Feb. 22, 2016.

Jan. 7, 2016 Reply to Jan. 5, 2016 Notice of Non-Compliant Amendment of U.S. Appl. No. 13/762,112.

Notice of Non-Compliant Amendment of U.S. Appl. No. 13/762,112 dated Jan. 5, 2016.

Sep. 30, 2015 Response to Jun. 30, 2015 Non-Final Office Action of U.S. Appl. No. 13/762,112.

Non Final Office Action of U.S. Appl. No. 13/762,112 dated Jun. 30, 2015.

Mar. 16, 2015 Reply to Dec. 16, 2014 Office Action of U.S. Appl. No. 13/762,112.

Non Final Office Action of U.S. Appl. No. 13/762,112 dated Dec. 16, 2014.

Aug. 27, 2014 Reply to Aug. 1, 2014 Restriction Requirement of U.S. Appl. No. 13/762,112.

Restriction Requirement of U.S. Appl. No. 13/762,112 dated Aug. 1, 2014.

Examiner Interview Summary of U.S. Appl. No. 13/762,112 dated Aug. 20, 2014.

Kappeler et al., "Pulsed-Power Performance and Stability of 880 NM GAALAS/GAAS Oxide-Stripe Lasers," IEEE Proceedings I. Solid-State & Electron Devices Institution of Electrical Engineers. Stevenage, GB, vol. 129, No. 6, Part I, Dec. 1, 1982 (Dec. 1, 1982), pp. 256-261.

European Office Action of European Application No. 13 779 236.2-556 (19022R-EP) dated Mar. 7, 2017.

* cited by examiner

METHODS OF DRIVING LASER DIODES, OPTICAL WAVELENGTH SWEEPING APPARATUS, AND OPTICAL MEASUREMENT SYSTEMS

CROSS-REFERENCE TO RELATED APPLICATIONS

The present application is a continuation of, and claims priority from, U.S. non-provisional patent application Ser. No. 13/762,112, entitled "Methods Of Driving Laser Diodes, Optical Wavelength Sweeping Apparatus, And Optical Measurement Systems," which was filed Feb. 7, 2013, which claims priority from U.S. Provisional Patent Application No. 61/716,410, entitled "Fast Wavelength Sweep Method For Standard Semiconductor Laser Diodes And Optical Fiber Sensor Interrogation Systems," which was filed Oct. 19, 2012, all of which are hereby incorporated by reference herein for all purposes.

FIELD

The present invention is related to sweep methods, system, and apparatus.

BACKGROUND

Change of emitted optical wavelength versus time, e.g. wavelength-sweep, is used within many photonic systems, such as during the interrogation of fiber-optic sensors, various spectrometric applications including chemical, biochemical and bio-medical sensing, telecommunication component measurements and testing, and the like. Furthermore, rapid wavelength sweep-rates are often desired. Rapid wavelength sweep allows for high-speed interrogation of optical sensors, which is often desired in dynamic sensing applications. Within multiplexed fiber-optic sensor arrays fast wavelength sweeps provide an opportunity for the time division multiplexing of sensors or sensor groups within sensor arrays. Multiplexed sensor arrays often consist of many spectrally-resolved sensors, such as fiber Bragg gratings, positioned along a single fiber. Interrogation of such arrays often requires high power optical sources to compensate for optical losses that are present in such arrays. In order to apply time-division multiplexing in such arrays, the wavelength sweep should be typically completed in less than about 1 µs, more typically in less than a few hundreds of ns, as the duration of the sweep determines the minimum distance amongst individual sensors with the same wavelength characteristics.

While there are many known solutions within laser design that can provide wavelength sweeping capability, the sweeping of wavelengths associated with semiconductor laser diodes remain limited to several relatively-complex solutions. Traditionally, semiconductor tunable/sweepable laser sources incorporate a semiconductor gain medium (e.g., a laser chip) and an external wavelength tunable optical feedback. One example is a large external cavity laser diode as described in U.S. Pat. No. 7,212,560. Such tunable/sweepable semiconductor lasers are usually configured within a Littman-Metcalf cavity arrangement. In this configuration, a laser chip which provides optical gain is coupled to external mode-selection filtering and tuning elements via bulk optical elements. In most external-cavity approaches, the external mode-selection filter is a diffraction grating that can also double as a mirror. External optical elements are mechanically adjustable to allow for changes in optical feedback geometry, which further leads to a change in the emitted wavelength. Such a configuration requires moving micro-mechanical parts that need to be configured into a well-defined geometrical configuration. Such tunable sources are therefore complex and expensive for production. Moreover, the sweep-rate may be limited by the mechanical system's Eigen frequencies. Thus, their wavelength sweep-rate may seldom exceed a kHz repetition rate.

Several types of fully-integrated tunable laser diodes have also been successfully developed. Such laser diodes do not require any external mechanical parts, since wavelength tuning is achieved directly by structures integrated into a laser chip. The first group of tunable laser diode sources utilizes distributed back reflectors (DBR) located at the side or sides of the active region of the laser diode. This provides wavelength selective optical feedback necessary for diode lasing. DBR diodes designs includes a two-section DBR (distributed back reflector) laser diode described in U.S. Pat. No. 6,862,394, a three-section DBR laser diode described in U.S. Pat. No. 6,806,114, and a multi-section DFB laser diode described in US Publication No. 2004/0136415. Wavelength tuning of such laser diodes is based on changes in the refractive indexes of one (two-section) or two (three-section) DBR regions of the laser diode. Change in the refractive index of a DBR region causes a shift in spectral characteristics of a laser diode's optical feedback, which results in a change of the output wavelength. Changes in the refractive index of the described laser diodes may be caused by electrical current, but can also be achieved by local changes of temperature, with heat-strips located at specific regions, as described in US Publication No. 2010/0309937. While DBR diodes can provide fast wavelength sweeping, they are relatively complex for production, may exhibit mode-hopping, and may be prone to generating additional noise. Generally, due to their complex structure, they are not widely used.

The second group of tunable laser diodes utilizes wavelength tuning structures that are integrated along (i.e. in parallel with) the diode's active region. One example is a tunable twin guide DFB (TTG-DFB) as described in U.S. Pat. No. 7,112,827. Another is a striped heater DFB laser as described in U.S. Pat. No. 5,173,909. This group of tunable laser diodes allows for wavelength tunability without mode hopping effects. Direct heating can typically induce wavelength sweeps within a range of about 5-10 ms.

Most existing tunable laser diode systems, as described above, have complex structures and are consequently not produced in high volumes. The tuning range of such laser sources do not often exceed about 8 nm and the diodes may exhibit mode-hopping effects. Except in the case of DBR-based diodes, the tuning speed/rate is usually also limited. This especially applies to all systems that utilize temperature-induced effects for wavelength tuning.

Due to the relatively high complexity and high costs of known tunable laser diodes and methods, there is a need for simpler and more cost-effective tunable laser sources. This is especially true in the field of interrogation of optical sensor(s). Thus, improved methods and systems to produce wide and rapid wavelength sweeps are sought.

SUMMARY

In one aspect, a method of driving a laser diode is provided. The method includes providing a laser diode having an active region including a thickness of less than 1 µm, an active region cross-section of less than 7 µm², and a ratio of active region volume to total laser diode volume of less than 1/300, and selectively and rapidly heating the active region and immediate vicinity by applying a current pulse to provide a peak increase in temperature of the active region and immediate vicinity of 30° C. or more at an end of the current pulse and to perform a wavelength sweep of emitted optical radiation which is greater than 5 nm.

In another aspect, an optical wavelength sweeping apparatus is provided. The optical wavelength sweeping apparatus includes a laser diode having an active region including a thickness of less than 1 µm, an active region cross-section of less than 7 µm$^2$, and a ratio of active region volume to total laser diode volume of less than 1/300, and a pulse generator coupled to the laser diode configured and operable to provide a current drive pulse to the laser diode to selectively and rapidly heat the active region and immediate vicinity to provide a peak increase in temperature of the active region and immediate vicinity of 30° C. or more at an end of the current pulse and to perform a wavelength sweep of emitted optical radiation which is greater than 5 nm.

In another aspect, an optical system configured to interrogate an optical sensor is provided. The optical system includes a laser diode having an active region, wherein the active region comprises a thickness of less than 1 µm, an active region cross-section of less than 7 µm$^2$, and a ratio of active region volume to total laser diode volume of less than 1/300, a pulse generator operably coupled to the laser diode and configured to provide a current drive pulse to the laser diode to selectively and rapidly heating the active region and immediate vicinity to provide a peak increase in temperature of the active region and immediate vicinity of 30° C. or more at an end of the current pulse and to perform a wavelength sweep of emitted optical radiation which is greater than 5 nm, an optical diverter coupled to the laser diode, an optical fiber, including one or more sensors, coupled to the optical diverter, and an observation device configured to process back-reflected optical signals.

Numerous other aspects are provided in accordance with these and other aspects of the invention. Other features and aspects of the present invention will become more fully apparent from the following detailed description, the appended claims, and the accompanying drawings.

BRIEF DESCRIPTIONS OF THE DRAWINGS

DETAILED DESCRIPTION

Figure 1:
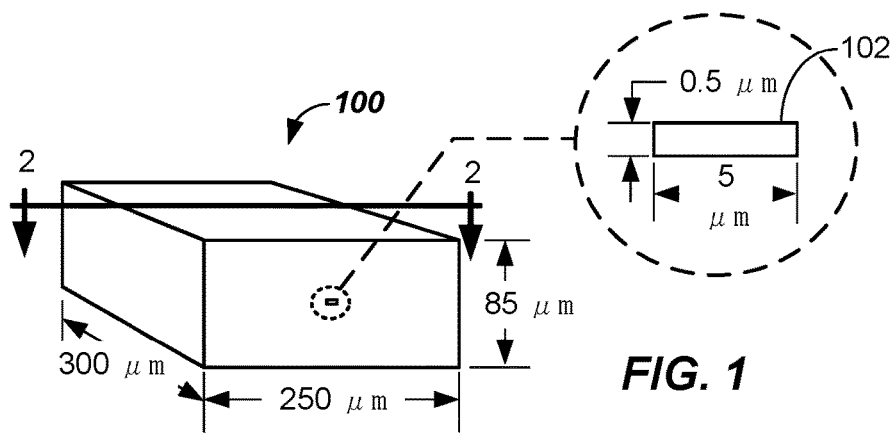
FIG. 1 illustrates typical dimensions of a laser diode chip.
Figure 2A:
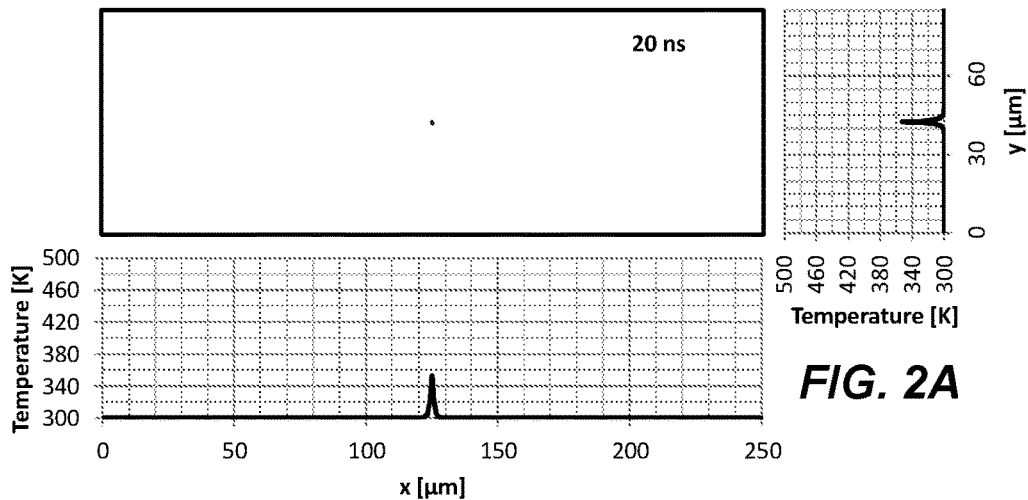
FIGS. 2A-2F show the simulated evolution of a temperature distribution within the cross-section of laser chip over time during a drive current pulse according to embodiments.
Figure 2B:
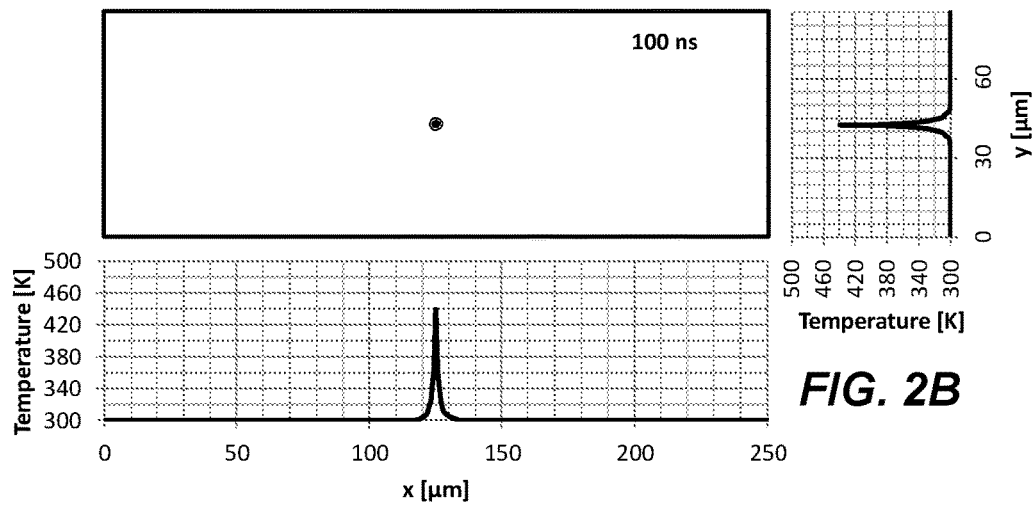
Figure 2C:
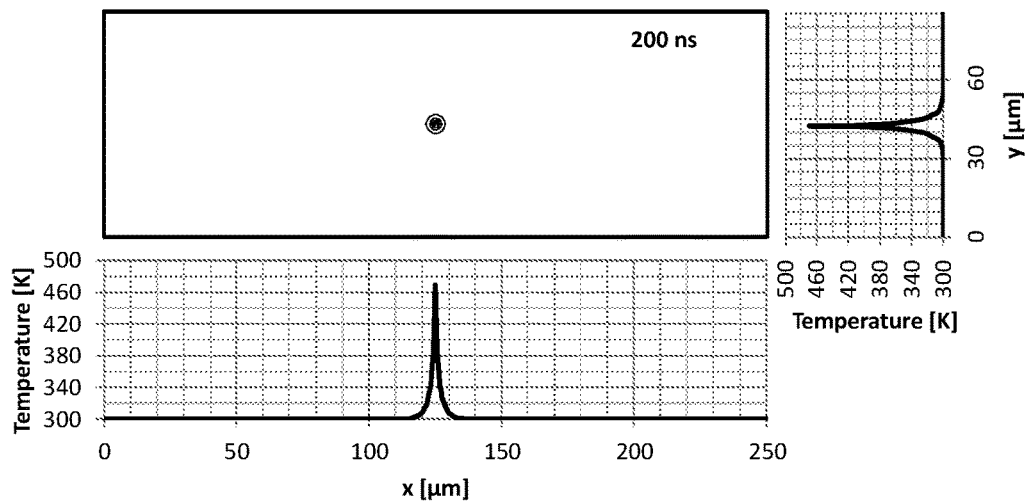
Figure 2D:
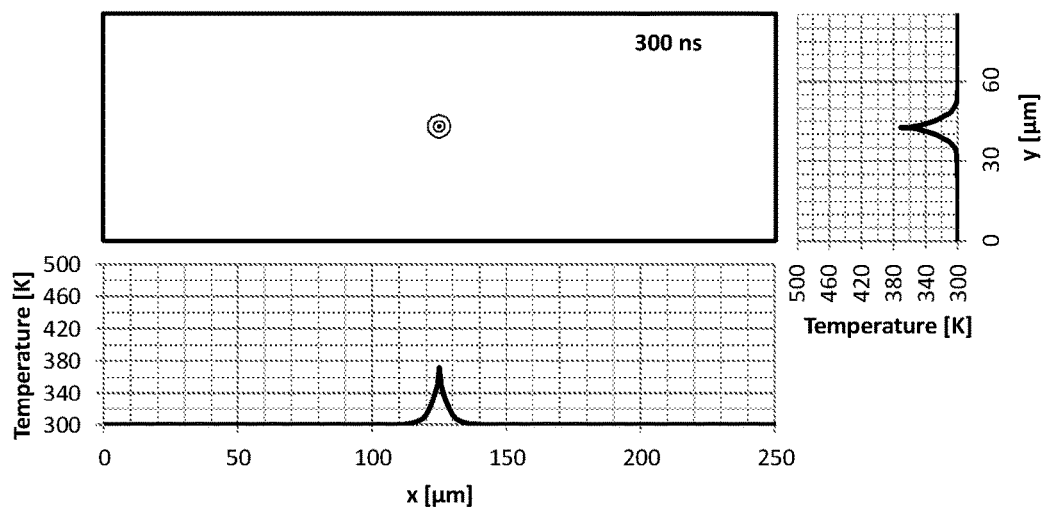
Figure 2E:
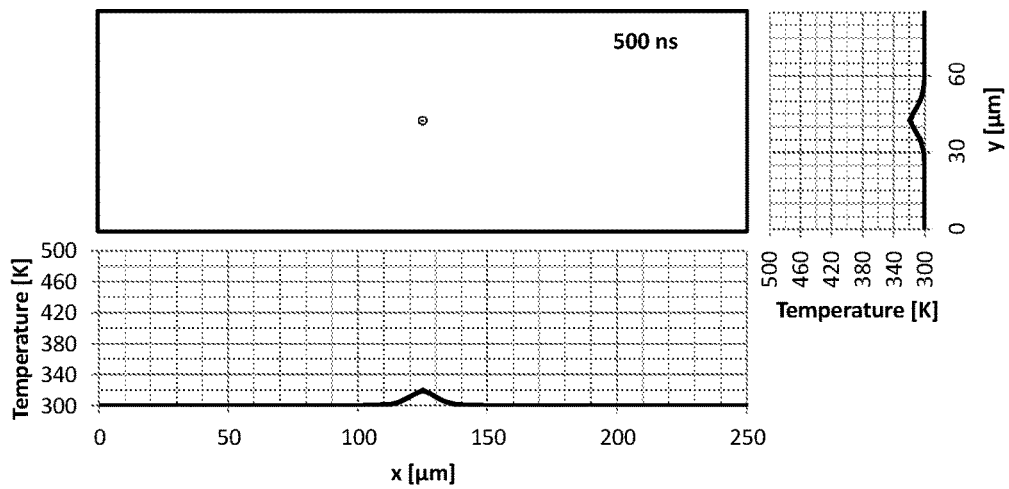
Figure 2F:
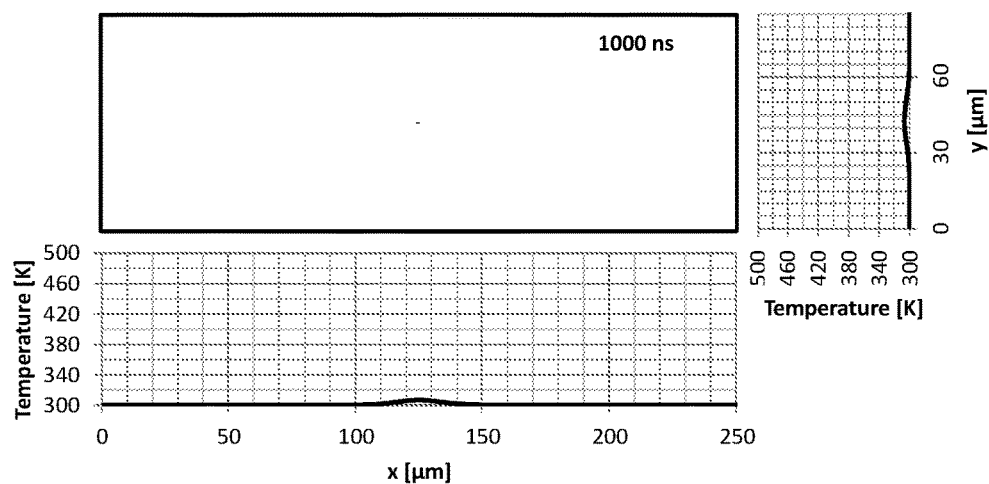

A distributed feedback (DFB) laser diode is a type of single-frequency laser diode that is currently produced in large quantities (mainly for telecommunication applications) at low-cost. The ability to use such laser diodes in measurement systems that require wavelength sweeping would thus be highly beneficial from the cost-performance perspective. The tunability of these devices is limited as conventionally operated. Thus, the potential for wavelength sweeping of these devices is also limited. Wavelength tuning of a DFB laser diode can be achieved either by temperature-cycling or by driven current modulation. Typically, a telecom DFB diode exhibits wavelength shift due to temperature of about 0.1 nm/° C. to about 0.2 nm/° C., and due to current modulation of approximately 10 pm/mA (depending on the diode design). While temperature-cycling can be used to sweep the diode wavelength over several nanometers, such a temperature-controlled wavelength sweeping usually takes several milliseconds or even seconds to conduct, as described in "Rapid temperature tuning of a 1.4-mm diode laser with application to high-pressure H2O absorption spectroscopy" (OPTICS LETTERS, Vol. 26, No. 20, Oct. 15, 2001). Drive current modulation can provide much faster wavelength sweeps, because the applied drive current can change rapidly, but conventionally only within a relatively-limited wavelength sweep range due to a maximum declared continuous DC drive current range. Furthermore, producers of telecommunication DFB diodes tend to reduce wavelength dependence on current, since it causes laser diode wavelength chirp during direct current modulation, which may degrade telecommunication system performance. A typical DFB diode wavelength can thus be continuously swept by current control for only a few tens of nm, e.g. for 0.1 nm to 0.5 nm as described in US Publication No. 2011/0249973. Current wavelength sweeping systems based on conventional DFB diodes can thus provide only limited wavelength sweep ranges and/or limited dynamic performance.

In view of the limitations and problems of the prior art, embodiments of the present invention provide measurement methods and measurement systems that can utilize a conventional DFB laser diode (such as a widely-available and low cost telecommunication DFB laser diode) to produce relatively wide and rapid wavelength sweeps. Embodiments of the present methods, systems, and apparatus described herein can also be extended to other types of laser diodes, in particular to single-frequency, horizontal-resonator laser diodes. Principles of embodiments of the invention can be applied to other types of single-frequency, hetero-structural, or quantum-well semiconductor lasers. For example, embodiments of the invention can be applied to laser diodes with resonators (e.g., horizontal resonators) that have relatively thin (low thickness) active regions (having thicknesses of less than 2 μm, or even less than 1 μm, or even less than 500 μm in some embodiments), or to laser diodes having a cross-sectional area of the active region that is considerably smaller than a cross-sectional area of the laser diode chip. "Considerably smaller" means 1,000 times or more smaller, 4,000 times or more smaller, or even 7,000 times or more smaller in some embodiments, than a cross-sectional dimension of the laser diode chip. Furthermore, it is preferable for the laser diode chip to have a feedback system that provides for a single-frequency operation; otherwise the emitted spectra might include many modes. In other words, the laser diode is a single-frequency diode.

One class of diodes that are used for the present method are DFB diodes having an active region 102 that has a thickness (e.g., vertical thickness) of less than 1 μm, an active region cross-section of less than 7 μm$^2$, and a ratio of active region volume to total laser diode volume of less than 1/300, or even less than 1/1,000 in some embodiments. These low volume ratios indicate low power laser diodes which are good candidates for sweeping apparatus, measurement systems, and measurement methods in described herein.

According to another aspect, the measurement system and wavelength sweeping apparatus intrinsically generates relatively-high optical power during a wavelength sweep. Furthermore, embodiments of the measurement system and wavelength sweeping apparatus can be configured to interrogate and time-multiplex several types of optical sensors, such as fiber Bragg gratings, Fabry-Perot interferometers, or other spectrally-resolved sensors or optical devices, rapidly and at low cost.

It is generally well-known that changes in the drive-current of a DFB laser will affect a wavelength of the laser diode emission output. This change in output wavelength ("wavelength shift") is generally referred to as wavelength chirp. It can be predominately attributed to a refractive index change of the resonator of the diode caused by a heating of the active region of the diode that contains the Bragg structure. The wavelength shift induced by the drive current supplied to the laser diode is, however, limited by the maximum declared continuous DC drive current of the diode. The maximum declared continuous DC drive current of the diode is defined by the thermal limitations of the semiconductor material of the diode. A typical telecom DFB laser diode permits a maximum declared continuous DC drive current within a range of between 50 mA and 100 mA. A typical DFB laser has optical emission power, typically between 1 mW and 10 mW, and also exhibits drive current-induced wavelength shift of the order of 10 pm/mA. This conventionally limits the wavelength sweep range to between 0.5 nm and 1 nm, even in extreme cases. Of course, this range is not sufficient for wavelength sweeping sensor interrogation methods.

The "active region" denotes a space within the laser diode where optical amplification occurs. Active region is where a majority of the carrier recombination takes place (i.e. where holes and electrons recombine). In laser diodes this region may be defined, for example, by a physical feature(s), such as a double heterostructure, i.e., a sandwich of three materials, wherein the middle material is very thin and forms the active region. The vertical dimension of this active region is defined by thickness of the material in the middle of the heterostructure sandwich. Multiple quantum well lasers have a similar structure, except the active region (material in the middle of "sandwich") may not be uniform but rather may be composed of many (typical 3-10 nm thick layers) of materials with alternating composition. The total thickness of this active region composed of alternating, ultra-thin layers is again typically less than about 1 μm thick, more typically about 500 nm thick or less.

Thus, typically, the active region has a submicron thickness or even a thickness within the range of a few hundred nanometers or less, in order to confine the recombination the charge carriers to a smaller volume and consequently provide the high-density charge carriers required for optical gain generation. The active region may be designed in the form of semiconductor heterostructure, multiple heterostructures, multiple quantum well, or similar semiconductor designs that confine the charge carrier recombination into a relatively small volume. When driving the electric current through the laser diode, a great majority of charge carrier recombination takes place within the active region of the laser diode, which also restricts the majority of the voltage drop to the same active region. Only a small fraction of the total voltage drop develops over the rest of the laser diode chip.

Furthermore, as shown in FIG. 1, the active region 102 is embedded within the bulk of the semiconductor material of the laser diode chip 100, which has relatively low electrical and thermal conductivity. When the electric current is driven through the semiconductor laser diode chip, most of the voltage drop is developed over the active region. This causes dissipation of heat from the same active region. The heat generation during the application of the drive current is, thus, predominantly limited to the active region of the diode. Accordingly, the generated heat is conducted through the rest of the laser chip to the surrounding diode case and is further dissipated to the surrounding environment. The steady-state temperature of the active region and the laser chip is a main factor that determines maximum declared continuous DC drive current, and thus maximum wavelength shift induced and achieved by direct current (DC) excitation. Thus, the DC driven, steady-state temperature of the laser chip depends on the thermal conductivity of the laser chip, diode case, junction between the laser chip and diode case, heat conduction from the diode case, and other factors that affect thermal resistance between the active region and surrounding environment.

A change in the emission wavelength is a consequence of a temperature-induced refractive index change of a semiconductor material that constitutes an optical feedback structure of the laser diode. In a DFB diode, the optical feedback structure may be a periodic formation, such as a Bragg grating or other optical formation. The optical feedback structure, which is usually located in the immediate vicinity (e.g., within about 500 nm or less) of the active region 102, and may be within about 120 nm to about 200 nm of the active region 102 in some embodiments, affects the optical field in the active region 102 through evanescent field interaction. In some embodiments, the optical feedback structure may be part of the active region 102. Heating of the active region 102 or the entire diode thus results in associated feedback structure heating, which causes a wavelength shift of emitted radiation due to its refractive index change.

According to one or more embodiments of the present invention, an active region of a laser diode and its immediate vicinity are selectively and rapidly heated. This selective and rapid heating is provided by application of short-duration, high-amplitude pulses. This allows for the performance of a fast wavelength sweep of emitted optical radiation. Complete wavelength sweeps in less than 500 ns may be achieved. In other embodiments, even faster sweeps, i.e., in less than 250 ns, or even in less than 100 ns, are possible by shortening of the pulse duration while simultaneously increasing the driven current amplitude. "Selectively heating" or "selective heating" as used herein means preferentially heating of the active region 102. Selective heating ensures that immediately after driven current pulse termination, that 90%, 95%, or even 99% of the total diode chip bulk volume remains at temperature that is less than 7 degrees C., less than 3 degrees C., or even less than 2 degrees C. above the chip temperature before the current pulse initiation.

Selective heating of the active region 102 of the laser diode 100 and the immediate vicinity thereof may be achieved by the application of a relatively short-duration, and high-amplitude drive current pulses. As recognized by the inventors herein, the selective heating of the active region and the immediate vicinity is possible due to the confinement of the voltage drop largely to the confines of the active region and immediate vicinity, which has relatively small dimensions, especially in comparison to the overall dimension of the laser chip. Accordingly, application of a high amplitude drive-current pulses of relatively short duration can thus selectively deliver heat only to the active region of the diode (and optical structures in a directly surrounding vicinity), thereby causing rapid and selective heating (increase in temperature). The selective and rapid heating comprises application of short-duration current drive pulses having a pulse duration, and amplitude sufficiently low to prevent a rise in an average bulk temperature of the laser chip above 30 degrees C., or even less than 10 degrees C., or even less than 7 degrees C., or even less that 3 degrees C. in some embodiments. From another viewpoint, selectively means that the temperature of active region 102 is at least 30 degrees C. higher, or even 40 degrees C. higher, or even 70 degrees C. higher at the end of a single current pulse than before application of the current pulse, while the average temperature of the diode chip 100 is increased by less than 10 degrees C., or even less than 7 degrees C., or even less than 5 degrees C., or even and less than 3 degrees C. in some embodiments.

In accordance with an aspect of the invention, a rapid heat-up sequence of the active region is provided, but where the bulk of the chip remains relatively close, as described above, to the average environmental temperature. The applied current pulse may be spontaneously followed by a prompt cool-down process as the heated active region is rapidly cooled by the surrounding cooler bulk mass of the chip. The active region resides within the bulk non-heated (relatively colder) laser chip and the heat conduction process provides dissipation of the heat generated across the entire volume of the laser chip.

Low duty ratio current pulses should be used to prevent any rise in the average temperature of the laser chip 100. A "duty ratio" as used herein is a ratio between a duration of the pulse (Lpul) and a sum of the duration of the pulse (Lpul) and pause (Lpau) between the pulses.

$$\text{Duty ratio}=L\text{pul}/(L\text{pul}+L\text{pau}) \qquad \text{Eqn. 1}$$

Short-duration, high-amplitude, laser diode drive-current pulses having a relatively low-duty ratio can thus provide rapid and selective heating as well as cooling cycles within the active region 102 and its immediate vicinity, while an average temperature of the laser chip 100 can remain relatively close to an average environmental temperature or a steady-state operating temperature. Duty ratios of less than about 1/10, or even less than about 1/30, or even less than about 1/100, or even less than about 1/1,000 may be used.

The maximum allowable amplitude of the driven current pulse when applied in a low duty ratio pulse excitation is considerably higher than in the case where continuous DC drive current excitation used in the prior art. Pulse amplitudes can usually be about 5 times to about 100 times larger than a maximum declared continuous DC drive current. The maximum declared continuous DC drive current is a limit on the driven current declared or specified by the manufacturer for continuous DC use without thermally damaging the laser diode 100. In other embodiments, pulse amplitudes may be 5 times larger, or even 5 times to 30 times larger, or even 5 times to 50 times larger, or even 100 times larger or more, or even 5 times to 300 times larger or more than the maximum declared continuous DC drive current in some embodiments.

The selective and rapid heating may be accomplished by causing a duration (e.g., a pulse width) of the short-duration driven current pulse to be less than about 50 µs, or even less than about 10 µs, or even less than about 5 µs, or even less than about 2 µs, or even less than about 1 µs, or even less than about 500 ns, or even less than about 100 ns in some embodiments. The shorter the pulse duration, the more rapidly the sweep may be accomplished. Limiting the pulse duration may prevent any significant rise in a bulk temperature of the laser chip. The combination of relatively short pulse duration and relatively higher pulse amplitude of the driven current pulses may also be used. The duration and amplitude may be selected in a way that a peak temperature of the active region remains below semiconductor degradation temperature, i.e., a temperature at which optical gain and consequently the output power of the laser diode 100 becomes degraded below a useful threshold. Since the peak temperature of the active region 102 depends on the energy delivered by the current pulse to the active region 102 and the initial temperature of the laser diode chip 100, the applied pulse duration and pulse amplitude may be selected taking into account the initial temperature of the laser diode chip. Typical peak increases of a temperature of the laser diode chip can be in the range between 30 degrees C. to 100 degrees C., or even more than 130 degrees C. when the laser diode chip is initially at room temperature. If the diode chip is actively cooled, such as with an active cooling device (e.g., a thermoelectric cooler) this range can be further extended. Typically, a range of wavelength operation may be extended and correlates to the reduction of the diode chip's environmental temperature. Furthermore, average bulk laser chip temperature increase due to the single-pulse application may be limited with such cooling to below 3 degrees C., or even below 0.5 degrees C. in some embodiments. During current pulse application, the increase of the average bulk chip temperature can be greater, however average temperature increases of greater than about 30 degrees C. are to be avoided by providing pulsed current to the diode 100 having short duration and duty ratios, cooling, or combinations thereof.

Rapid temperature cycling of the active region 102 and its vicinity, achieved by short duration, high-amplitude pulse excitation, may lead to rapid changes of optical parameters within the optical feedback system of the laser diode chip, as already explained above. These rapid changes lead to rapid sweeps of the wavelength output of the laser diode chip. For example, in a DFB diode the active region 102 also confines the optical field and provides guidance between the front and back sides of the laser diode 100. Furthermore, in the immediate vicinity of the active region 102, an optical feedback structure comprising a periodic (Bragg) structure is located that provides optical feedback for laser oscillations that further determine diode emission wavelength. Rapid temperature variations of the active region and its immediate vicinity thus cause rapid changes in the refractive index of the material that forms the optical feedback structure comprising the Bragg structure, which leads to rapid changes in the emission wavelength of the DFB laser diode.

Numerical and experimental investigations were performed on various types of commercial telecom DFB laser diodes to determine the driven current amplitude limits when operated in low-duty cycle ratio regime of operation and associated wavelength sweep-ranges achievable. Detailed examples of these investigations are given below.

Finite-element modeling of the thermodynamic behavior was performed for a typical laser diode, in order to assess temperature changes that would be feasible in a typical active region of a DFB diode, while also preventing permanent damage to the diode. The DFB laser diode was modeled as an InP (Indium phosphide) laser diode chip. It was assumed that the laser diode chip had a thermal conductivity of 40 $Wm^{-1}K^{-1}$ and specific heat of 3100 $Jkg^{-1}K^{-1}$ with dimensions of 250 μm×300 μm×85 μm, as shown in FIG. 1. The modeled active region 102 was made from InGaAsP (Indium Gallium Arsenide Phosphide). It was assumed for the modeled active region 102 that the thermal conductivity was 6 $Wm^{-1}K^{-1}$ and the specific heat was 3100 $Jkg^{-1}K^{-1}$, and the modeled dimensions were 5 μm×300 μm×0.5 μm, as shown in FIG. 1.

It was further assumed that the diode chip is fixed into the case having a constant temperature at 300 degrees K with air as the surrounding medium with a free convection coefficient of 20 $W/m^2K$. FIGS. 2A-2F show various plots of simulated temperature distribution evolution over time in a transverse plane (along section 2-2 of FIG. 1) of the laser diode over time-steps corresponding 20 nm, 100 nm, 200 nm, 300 nm, 500 nm, and 1,000 nm after turning the current pulse on and starting to deliver 6 W of heating power to the active region 102 and then rapid cooling thereof. The model assumed a typical heating power of 6 W that is released within the active region 102. 6 W of heating power can be, for example, generated by a voltage drop of 2 V over active region and drive current amplitude of 3 A. The diode cross-section had dimensions as presented in FIG. 1. The duration of the simulated pulse was 250 ns in this model. The various plots illustrate that the temperature rises rapidly upon imparting the current pulse, but the temperature is only locally increased. Similarly, the plots illustrate that the temperature rapidly returns to near that of the bulk of the diode chip 100.

Figure 3:
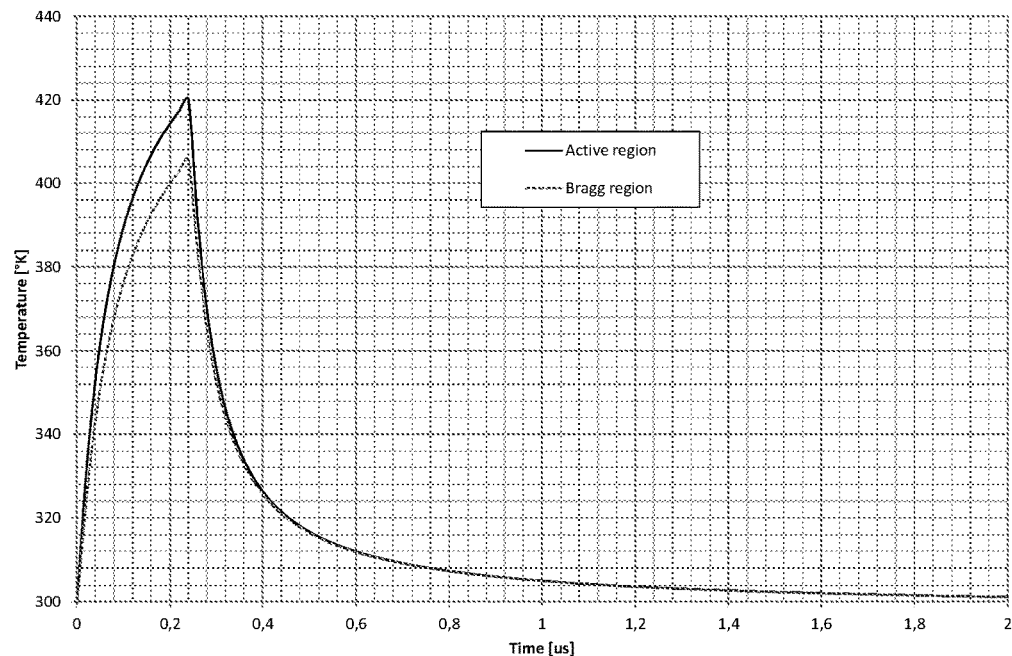
FIG. 3 illustrates a simulated change of the temperature in the center of the active region and in the immediate vicinity 0.2 µm away from the active region after pulse excitation of the laser diode.

FIG. 3 shows a plot of temperature versus time illustrating dependence in the center of the active region 102 and the temperature of a region in the immediate vicinity (0.2 μm away) from the top boundary of the active region 102. After termination of the pulse (at about 0.24 microseconds), a formed heatwave continues to propagate through the chip 100 towards the outer surface of the chip 100, while a temperature of the active region 102 starts to fall, almost exponentially, with a time-constant of about 100 ns. A full temperature recovery of the active region 102 to be substantially the same as the surrounding temperature of the laser chip 100 takes approximately 10 to 20 μs. Substantially the same, as used in this context, means within about 99% or less of a temperature of the bulk temperature. FIG. 3 also illustrates a minimum necessary pulse-off state to prevent a significant rise of a temperature of the laser chip 100 above the diode case temperature during an instance of continuous pulse excitation.

As shown by this numerical model simulation, large and rapid changes in a temperature of the active region 102 and its immediate vicinity are possible by application of high-peak amplitude, short-duration, and low-duty ratio pulse excitation of a typical DFB diode (e.g., a telecom DFB diode). An absolute upper temperature of the active region 102 may be defined by a loss of semiconducting properties of the active region 102 (and associated optical gain decrease) and temperature-induced degradation of the semiconductor material, which may lies above about 140 degrees C. Since a typical change in temperature of 1 degree C. in a modeled InGaAsP diodes causes a 0.05 nm to 0.10 nm wavelength shift of the laser emission, wavelength shifts of greater than 5 nm, or even greater than 7 nm, or even greater than 10 nm or may be achieved. The full temperature change range, and thus wavelength sweep-range, could be further extended by lowering the initial (case) temperature of the laser diode such as, for example, by utilizing a thermoelectric cooler.

Figure 4:
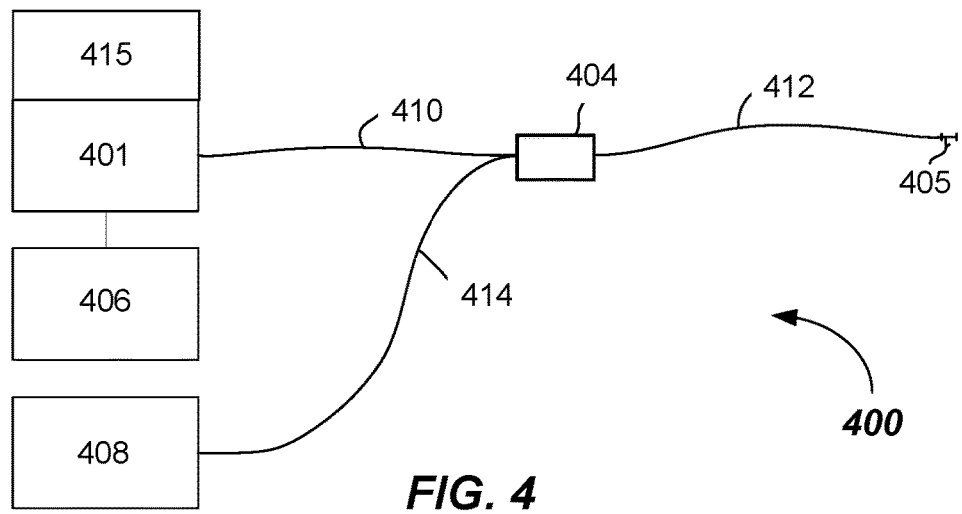
FIG. 4 represents the test setup for measuring the wavelength sweep of a laser diode.

Several experimental example telecom laser diodes were measured in a measurement system 400 to confirm the above assumptions and simulations. A first example of a measurement system 400 is shown in FIG. 4. The measurement system 400 includes a laser diode 401 (e.g., a DFB laser diode) which is undergoing the test, an optical coupler 404 (e.g., a 3 dB optical coupler), an optical sensor 405, which in this case is wavelength reference such as a reference all-fiber, Fabry-Perot etalon (e.g., having a 5% average reflectivity), a current pulse generator 406 (such as a programmable current pulse generator), such as for example a pulse generator constructed from microcontroller, MOSFET driver, and MOSFET transistor which all together act as fast current switch to drive the laser diode 401, and an observation device 408 that allows processing and/or observation of constantly varying signals (e.g., currents or voltages), and which may plot or display the processed data as a two-dimensional graph of one or more electrical currents or potential differences. The data may be displayed using the y axis, and plotted as a function of time (x axis). One example of an observation device 408 is an optical oscilloscope 408 (e.g. a HP 83480A model oscilloscope with optical module HP 83485B), and various sections of single-mode optical fiber 410, 412, and 414 at each branch of the optical coupler 404. A standard single mode optical fiber, such as SMF-28® optical fiber available from Corning Incorporated may be used. Other optical fibers may be used.

The optical sensor 405, in this example is a reference Fabry-Perot etalon, and was created by the formation of a semi-reflective mirror within optical-fiber that was placed about 0.85 mm away from the flat-cleaved fiber-end. In-fiber mirror formation is described in detail in "Low-loss semi-reflective in-fiber mirrors" (Cibula E, Donlagic D., Optics Express, Vol. 18, Issue 11, pp. 12017-12026, 2010). The all-fiber Fabry-Perot etalon had free spectral range (FSR) that corresponded to 0.96 nm at 1550 nm and mirror reflectances of about 3.2% for the first mirror (air cavity within optical-fiber) and 3.6% for the second mirror (flat cleaved optical-fiber).

The pulse generator 406 was set to trigger pulses having a duration of 250 μs, an amplitude of about 2 A with a repetition rate of about 10 kHz. After the optical pulse was triggered, it traveled through single-mode optical-fiber section 410 to the optical coupler 404, then further along the single-mode optical-fiber section 412 to the optical sensor 405 (e.g., a Fabry-Perot etalon). The optical pulse was then reflected from the optical sensor 405 and was further guided by the fiber section 412 to the optical coupler 404 where it was split into two branches using the 3-dB division ratio of the optical coupler 404. The branch containing the single-mode optical fiber section 414 led the back-reflected pulse to the observation device 408, which further displays the reflected pulse power versus time characteristics. The pulse duration was gradually increased while observing the back-reflected signal from the optical sensor 405. The pulse duration was limited to a particular value when any further prolongation of the pulse duration caused the temperature of the active region (e.g., 102) of the laser diode 401 to rise to the level that lowered the gain and consequently affected the diode's output power below a useful threshold.

Figure 5:
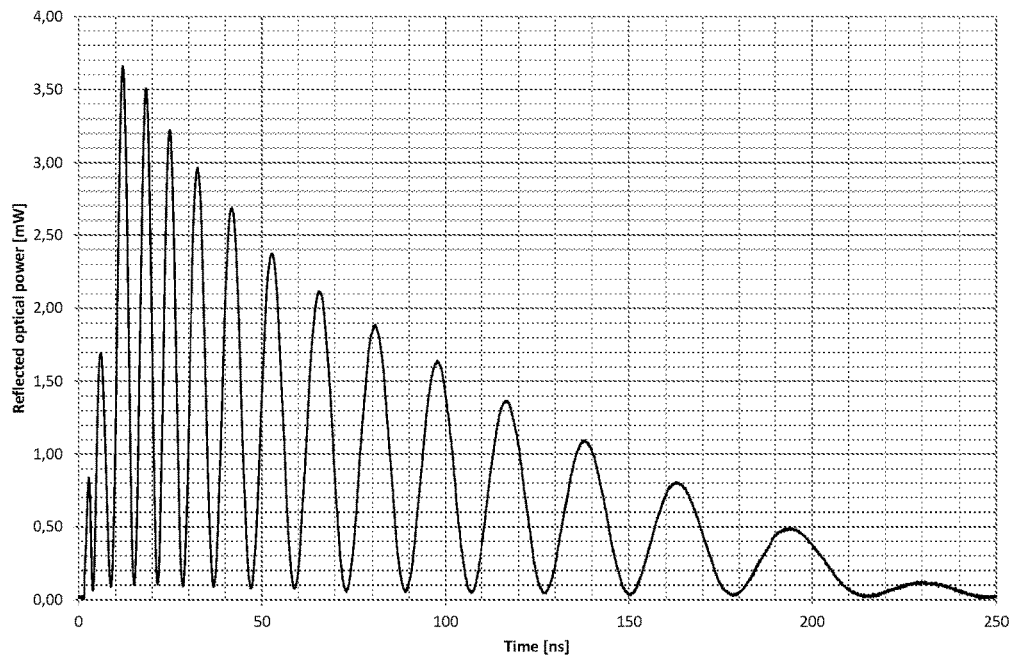
FIG. 5 shows a reflected optical power vs. time plot of a light pulse reflected from an all-fiber Fabry-Perot etalon with about 4% reflectivity.
Figure 6:
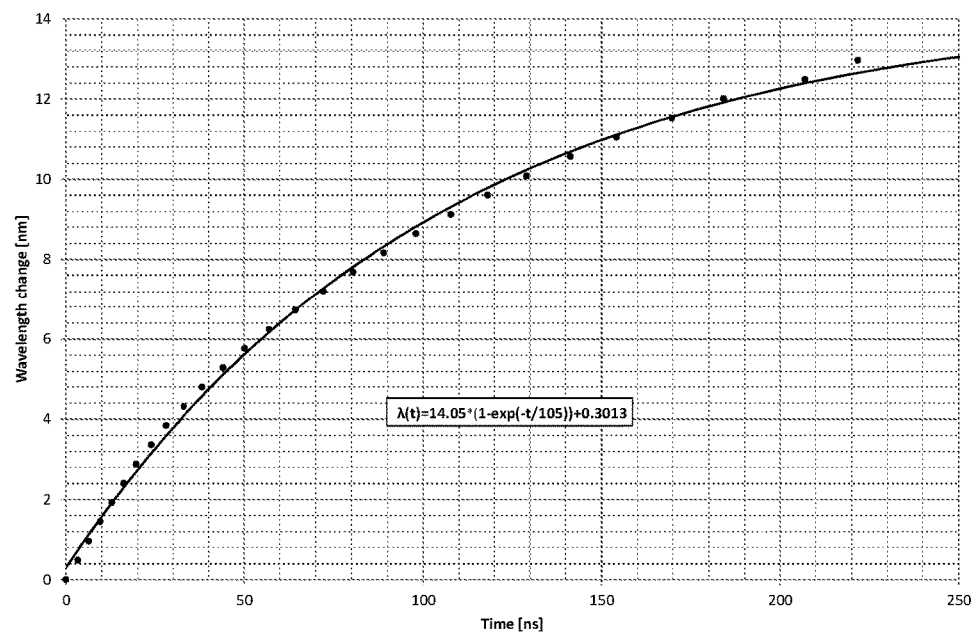
FIG. 6 illustrates the wavelength change over time of a laser diode during application of short duration pulses.

A wavelength change versus time during pulse duration was reconstructed to form a response of the optical sensor 405 (e.g., the Fabry-Perot etalon). Each full-fringe, e.g., each new peak within the back-reflected spectra represents a wavelength change that corresponds to the free spectral range of the reference Fabry-Perot etalon (e.g., 0.96 nm). The reconstructed emitted wavelength change during the pulse duration obtained from the data in FIG. 5 is represented in FIG. 6. It is clear from FIG. 6 that a wavelength change (wavelength sweep) of greater than 10 nm is achieved in less than 250 ns.

Figure 7:
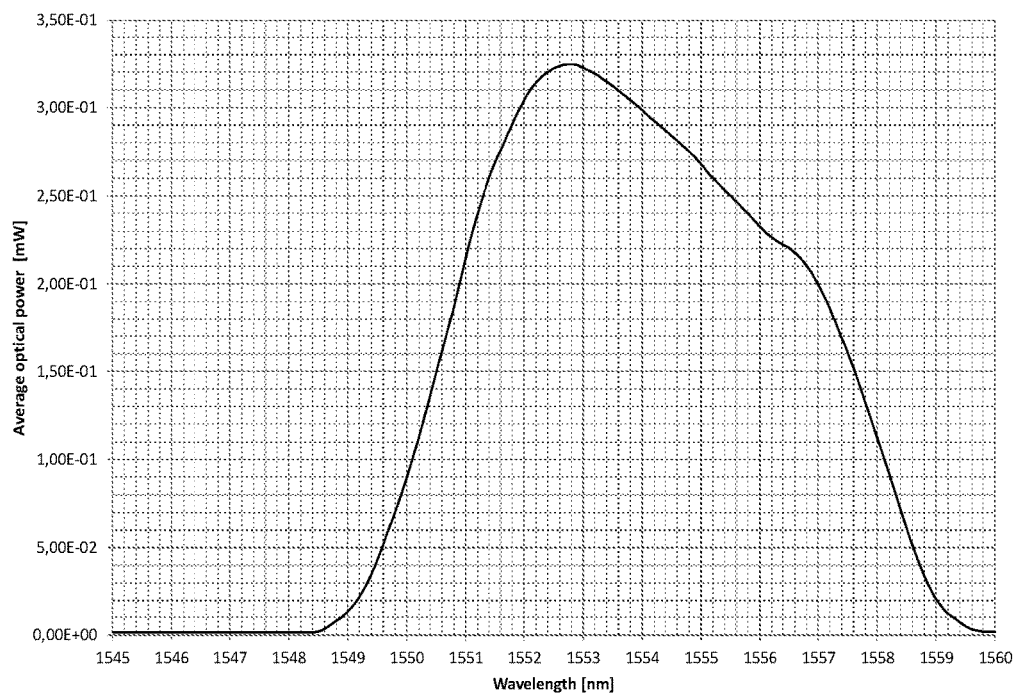
FIG. 7 illustrates a laser diode spectrum recorded by a grating spectrometer.

The experimental results shown in FIG. 5 to FIG. 7 were obtained by experimentally testing a typical commercial DFB laser diode type OSMLDP-D513BF2G, produced by SICHUAN OSEMOS ELECTRONIC TECHNOLOGY INC, China. FIG. 5 represents the back-reflected optical power over the total pulse duration, which corresponded to 250 ns.

Figure 8:
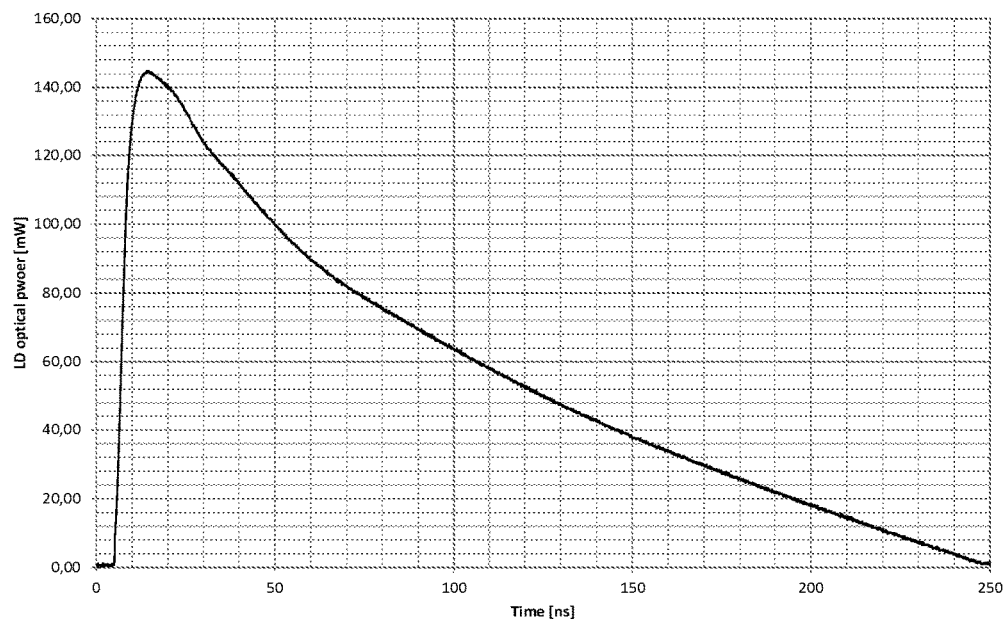
FIG. 8 illustrates a plot of output optical power of a laser diode during short duration pulsing.

In order to further confirm the above result, the oscilloscope acting as the observation device 408 was replaced by a grating spectrometer. The spectrometer, acting as the observation device 408, confirmed that the average generated optical power spectrum exceeded a 10 nm width, as shown in FIG. 7. Furthermore, the output power versus time of the diode 401 was measured, which indicated the peak power of the laser diode 401 was within the range of 140 mW (at the beginning of the pulse) and at a minimum power (at the end of the pulse) corresponding to about 10 mW (at end of the pulse when the temperature of the active region 102 was the highest), as shown in FIG. 8. Average optical power is around 60 mW when operated in pulsed mode. The laser diode 401 had a declared maximum continuous nominal output power of 2 mW or less when powered with continuous DC power. Such high optical power generated by the present laser diode operating method is advantageous for all measurement systems that suffer from high optical losses. In particular, the generation of high optical power might be of special importance in multiplexed sensor measurement systems, such as time division multiplexed measurement systems, where many optical sensors reside along a single optical fiber line, and thus each optical sensor contributes to loss within the measurement system. By applying selected amplitude and pulse duration of a current pulse to the laser diode, method embodiments of the present invention may produce peak optical power at the output of the laser diode that is 5 times higher, or even 10 times higher, or even 30 times higher, or even 50 times higher, or more than a maximum declared continuous DC drive current declared by the manufacturer.

The change in output optical power of the laser diode during short-duration, high-current pulse is a good indication of practical current amplitude and duration limits that can be imposed. Overheating of active region is indicated by a rapid drop in the emitted optical power. Therefore, observation the optical power at the end of the applied current pulse can be used as an indicator of maximum electrical pulse amplitude at give pulse duration. Too high of an amplitude will overheat the active region.

Figure 9:
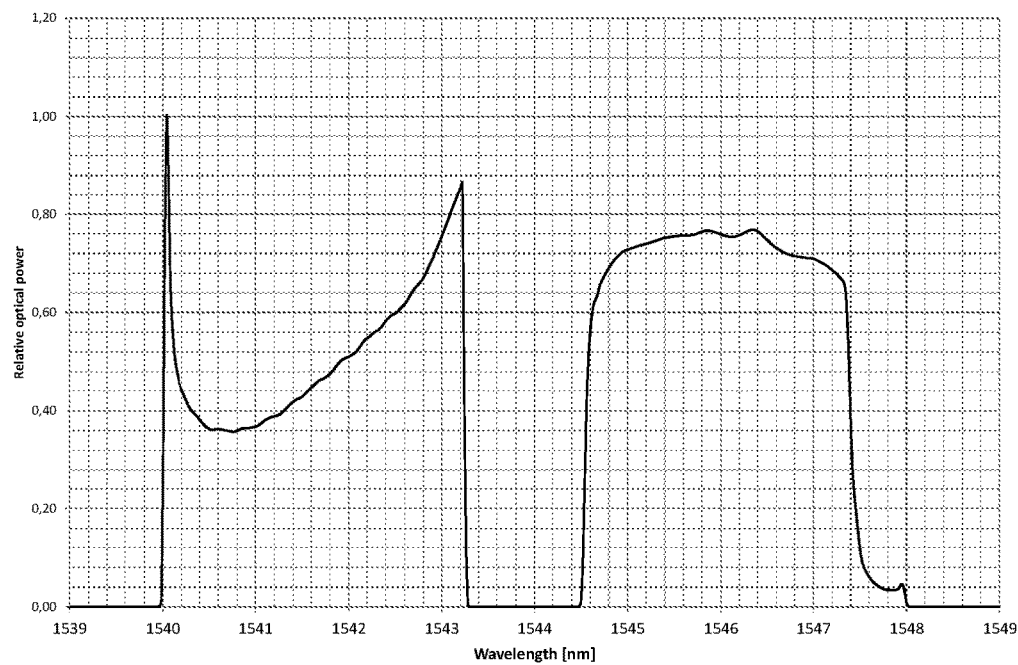
FIG. 9 illustrates a plot of a spectrum of relative optical power over wavelength of a mode hopping DFB laser diode.
Figure 10:
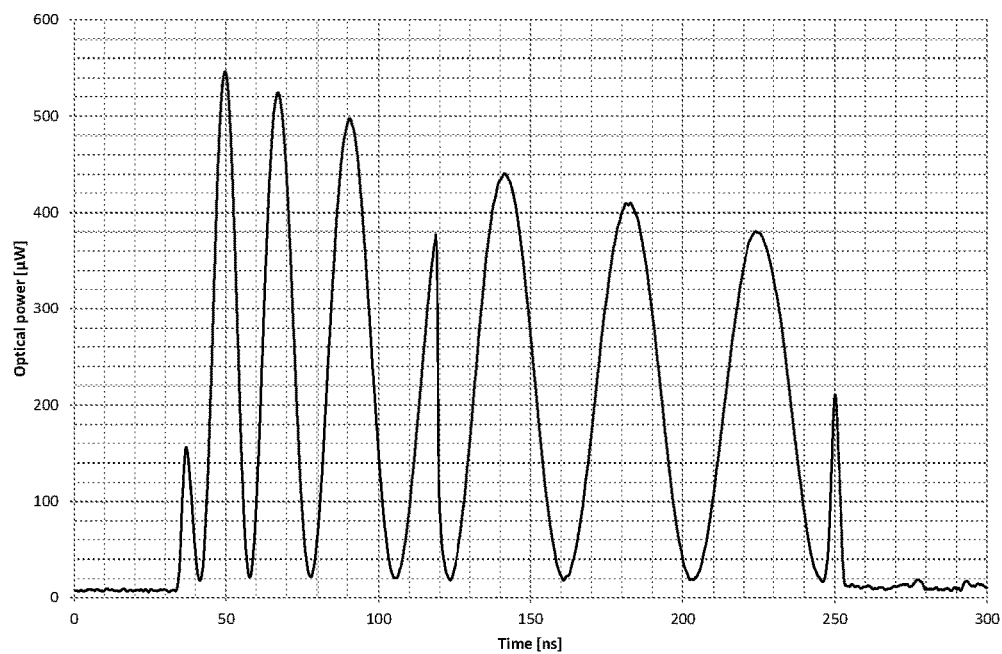
FIG. 10 represents the reflected optical power from an FP interferometer that is emitted by mode-hopping DFB laser diode.

The laser diode under test (e.g., a Osemos OSMLDP-D513BF2G) exhibited a continuous wavelength shift over the pulse duration. However, it should be noted that this is not the case with all commercial DFB diode types. High current is also associated with high optical gain and temperature change within an active region, which can lead to mode hopping. Such an example of mode hopping is shown in FIG. 9. In this example, the laser diode under test was LD-PF2-D5102-1GR by WAVE SPECTRUM, China. The laser diode first shifts its wavelength for 3.2 nm, hops for 1.2 nm, and then finally further shifts continuously for another 3 nm. Furthermore, the laser diode exhibited smaller emitted maximum optical power compared to the previous example laser diode. In FIG. 10, for example, emitted light from mode hopping in the diode was reflected by the optical sensor 405 (e.g., an all-fiber Fabry-Perot interferometer). Mode hop is clearly visible as discontinuity in recorded time response at about 120 ns in FIG. 10. During the investigation, the inventors discovered that the mode hopping occurred consistently at the same wavelengths in the case of a particular diode, therefore even laser diodes that exhibit mode-hopping can be used in certain applications, particularly when appropriate signal-processing is used.

In general, it is desired to use a laser diode 401 that exhibits a continuous wavelength shift over the entire pulse current and duration span. Furthermore, it should be stressed that some telecom laser diodes exhibit relatively lower wavelength shift under the described pulse excitation. This may be due to the intrinsic design of the laser diode, which aims to suppress wavelength shift caused by any current changes. Wavelength modulation or chirp caused by modulation of the drive-current is, in general, an undesirable characteristic within telecom systems since it increases adverse effects of chromatic dispersion. Certain telecom diode designs therefore tend to introduce various design measures to limit any wavelength sensitivities of the laser diode to current modulation. Such sensitivities can, in such cases, limit achievable wavelength sweep-range. It was noticed, for example, that laser diodes intended for direct modulation and certain diodes for use in DWDM systems, such as produced by Oclaro Inc, USA, exhibited much lower wavelength shift than most of the other tested diodes.

In another aspect, wavelength versus time $\lambda(t)$ characteristics of emitted optical radiation follows the temperature versus time characteristics of the active region 102. When short duration, rectangular-shaped current pulses are used for laser diode excitation, the temperature and consequently the wavelength versus time $\lambda(t)$ characteristics are nonlinear, e.g. approximately exponentially-asymptotic, as shown for example in FIG. 6. Most applications, especially measurement applications, however it is desired to have a substantially linear wavelength change versus time. In such cases, proper shaping of the current pulse can be applied to achieve a linear wavelength change versus time. In accordance with another aspect, linearization of the wavelength versus time $\lambda(t)$ characteristics may be accomplished by current pulse shaping that can be achieved by the application of a pulse generator 406 coupled to the laser diode 401 that may be fast programmable. Pulse shaping comprises shaping the pulse to substantially linearize the change in output over a wavelength range.

Figure 11:
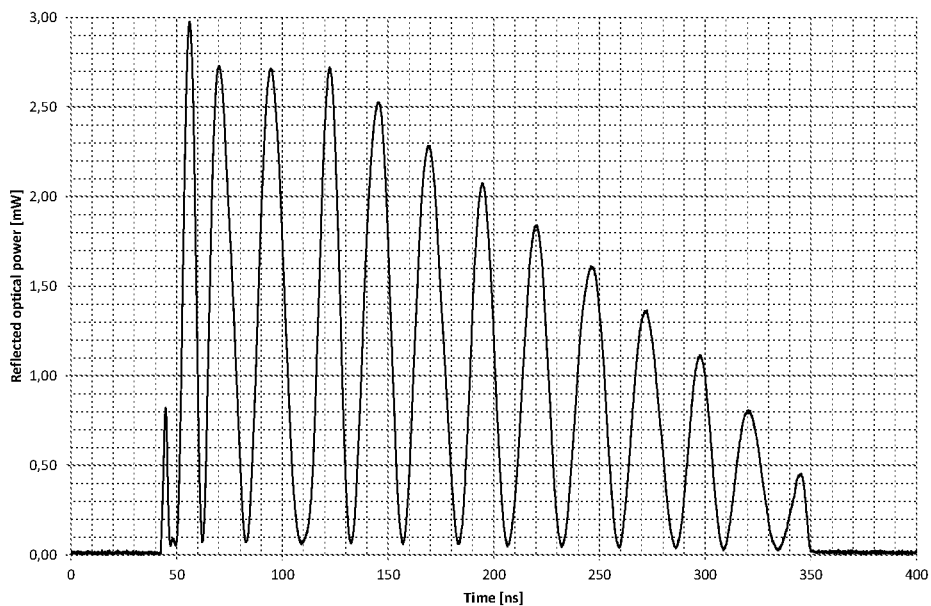
FIG. 11 shows a plot of reflected optical power over time of a linear wavelength light pulse reflected from an all-fiber Fabry-Perot etalon.
Figure 12:
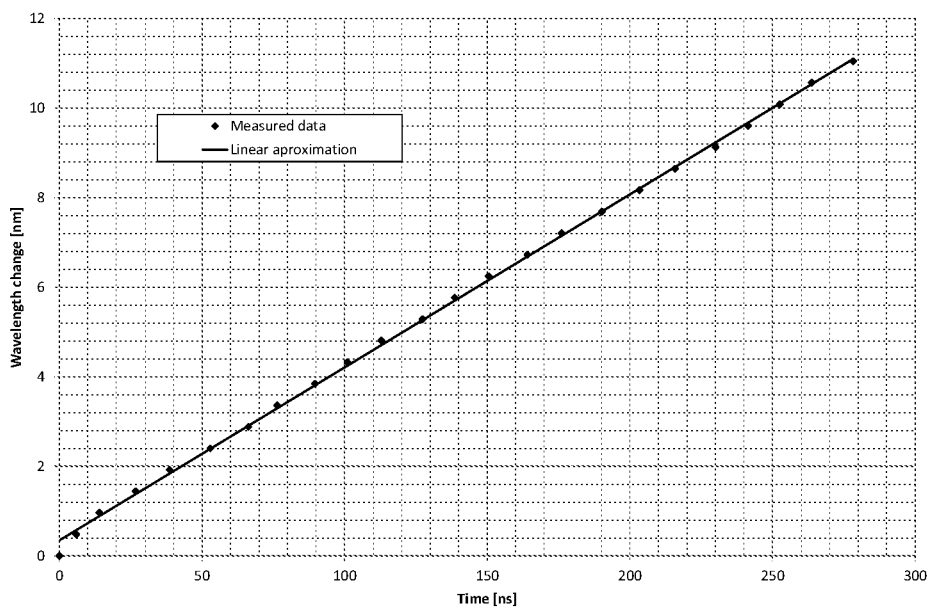
FIG. 12 illustrates the linear wavelength change of a laser diode during electric pulse application.
Figure 13:
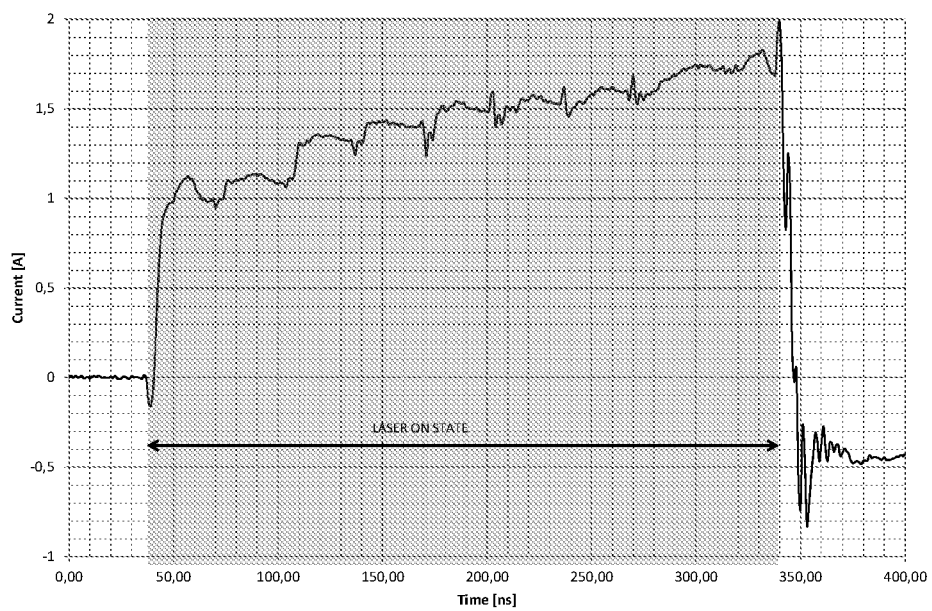
FIG. 13 illustrates an experimentally-determined electrical pulse shape used to drive a laser diode, which produced substantially linear wavelength sweep.

In one embodiment, system modeling may be applied to determine the required current versus time characteristics, i.e., the pulse shape, which will provide a relatively linear wavelength vs. time sweep, a heuristic approach can also yield good results. In another embodiment, heuristic linearization of the wavelength versus time characteristics is shown in FIG. 11 and FIG. 12. The same laser diode 401, as was used in previous tests (e.g., Osemos OSMLDP-D513BF2G), was excited by the short duration, current pulse shown in FIG. 13. The driven pulse supplied to the laser diode 401 had a duration of about 300 ns or less, and an average current amplitude of about 1.5 A. The driven current pulse shape, in the depicted embodiments, has a shape that increases in amplitude over the length of the pulse. The amplitude may increase by about 25% or more over the pulse length. For example, the depicted pulse is driven to increase rapidly to about 1 A at the beginning of the pulse (ignoring transients) and then increased to about 2 A over a pulse length of about 300 ns. The response of the optical sensor 405 (e.g., a Fabry-Perot etalon) is shown in FIG. 11. A reconstructed wavelength shift versus time plot is shown in FIG. 12, where a nearly linear relation between wavelength (in nm) and time (in ns) was obtained. An approximately linear wavelength shift of greater than 10 nm was measured in less than 300 ns. Approximately linear as used in this context means varying less than about 5% from a linear curve fit of the data.

In some embodiments, it is desired to drive the current pulse applied to the laser diode with an amplitude and pulse duration selected in a way to provide a ratio of a peak optical power at a beginning of the pulse (discounting transients) to a minimum optical power at the end of the pulse duration of less than 15:1, or even less than 10:1. The ratio of the emitted peak pulse power to the optical power at the end of a pulse indicates appropriateness of pulse duration and current pulse amplitude selection. To prevent unnecessary active region overheating and to maintain acceptable emitted pulse optical power range this rate shall be limited to not more than ratios above. Extension of pulse or amplitude beyond these limits may unnecessarily thermally stresses the laser diode and can lead to life-time reduction or diode distraction.

A pulse generator 406 (e.g., a fast programmable pulse-generator) operable to produce a drive current having a desired pulse shape to drive the diode 401 can be implemented in many ways. One embodiment, the pulse generator 406 includes generation (e.g., an increase) of current amplitude over a number of discrete time intervals, such as by the pulse generator 406 shown in FIG. 14. In particular, a series of N transistors 1441-1443 may be set or provided in a circuit in parallel, as shown, and electrically connected to the laser diode 1401 through N resistors with different resistances 1451-1453. The pulse is then generated by sequential switching of the N transistors 1441-1443 in on-state and after switching the last transistor 1443 in the on-state, all transistors 1441-1443 are switched off to terminate the current pulse.

Each resistor 1451-1453 includes a resistor magnitude that determines the current that is added to the total current flowing through the laser diode 1401. By selecting appropriate resistor values, the desired current versus time characteristics, i.e., pulse shape, can be obtained. While such an approach provides discrete increases in drive current, the total current is partially smoothed out due to the parasitic and/or possible intentional inductances that are or could be present in the electrical circuit. Since the time between the switching of the neighboring transistors should be considerably shorter than the time-constant of the laser diode 1401, the thermal inertia of the active region 102 will also prevent discrete hops in its temperature, consequently leading to a relatively continuous and smooth wavelength-change versus time. For example, a chain of eight transistors was used in one example to obtain the drive current shown in FIG. 13 while the resistance values 1451-1453 were set heuristically to obtain linear wavelength versus time response. Even through the generation of the drive current to the laser diode 1401 over eight discrete steps caused discrete changes in the current amplitude, the final wavelength shift was continuous and substantially linear, likely due to the thermal inertia of the active region 102, as explained above.

In addition, a reference all-fiber Fabry-Perot etalon or another wavelength reference could be permanently included within a measurement system to provide feedback and adjustment to dynamic pulse-shaping either to compensate for changing diode characteristics or to provide more versatility when shaping wavelength versus time characteristics. Several examples are described herein.

Figure 15:
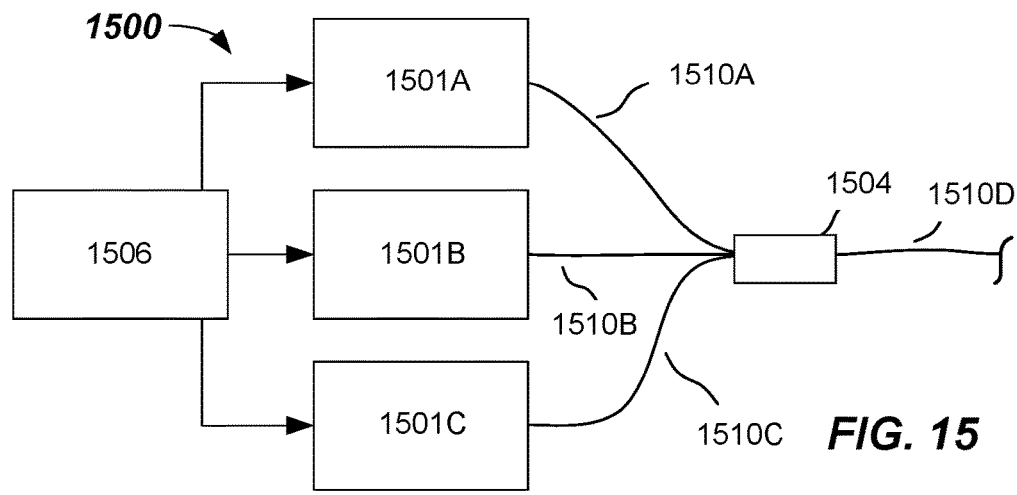
FIG. 15 illustrates a wavelength sweeping apparatus including multiple laser diodes extending the wavelength range according to embodiments.

Other types of custom or integrated pulse generators 406 for pulsed driving of laser diodes 401 can be used instead of the discrete transistors switches described above. Many cost-efficient integrated solutions, such as drivers for laser projectors, Blue-Ray disc players/recorders or even digital-video-disc (DVD) players can be successfully utilized as a pulse generator 406 to drive a laser diode 401 within a measurement system 400 described herein. Such a pulse generator 406 often allows for current programming, which can be utilized to adjust the output wavelength versus time characteristic of the laser diode 401 during its operation, as described above. Pulse generators that use passive or active analog circuits such as resistance-inductance-capacitance (R-L-C) circuits, can be also used for supplying appropriately shaped current pulses. These can be also combined with combinations of discrete switches to achieve control of pulse shape. As shown in FIG. 15, in order to provide and cover an even broader wavelength sweep range, the optical sweeping apparatus 1500 may include multiple laser diodes 1501A-1501C with different initial wavelengths and/or wavelength spans. The laser diodes 1501A-1501C can be configured in parallel by using a combining device 1504 coupled to the laser diodes 1501A-1501C. The combining device 1504 can be, for example, a coupler, a circulator, or DWDM combiner. This combining device 1504 may have as many input ports or channels 1510A-1510C as the number of laser diodes 1501A-1501C within the optical sweeping apparatus 1500. The optical sweeping apparatus 1500 may include one output port 1510D (shown truncated) that may further connect to an optical part (e.g., another optical diverter coupler) of the signal processing unit (not shown, but may include, for example, 404, 412, 414 and 408 as in FIG. 4). Each laser diode 1501A-1501C may be pulsed in consecutive order to cover a broad wavelength range. The pulses may be generated by a pulse generator 1506 coupled to and adapted to supply drive current pulses to each of the laser diodes 1501A-1501C. For example, the first laser diode with the shortest initial wavelength 1501A may be swept from its initial to its maximum wavelength. This maximum wavelength should coincide with the initial wavelength of the next laser diode 1501B. When the sweep of the first laser diode 1501A is finished, the second laser diode 1501B is swept across the second wavelength range abutting the first wavelength range in the same manner as the first laser diode 1501A, and so on. The result should be a broad and continuous wavelength sweep across a broader wavelength range that well-exceeds a wavelength sweep range achievable by a single laser diode.

In another embodiment, a wavelength sweep range capability of the optical sweeping apparatus 400 having the laser diode 401 can be extended by, in one embodiment, actively lowering a bulk temperature of the laser diode 401. Lowering the bulk temperature of the diode 401 reduces an initial temperature of the active region 102 of the diode 401 and consequently the initial emission wavelength. This increases total available temperature sweep span of the active region 102 and the immediate vicinity thereof. The upper temperature limit of the active region 102 is limited by semiconductor properties, as explained previously. Lowering of a temperature of the laser diode 401 can be, for example, achieved by application of a thermoelectric cooler 415 in thermal contact with the laser diode 401 as shown in FIG. 4. The thermoelectric cooler 415 may be either integrated within the same case as laser diode 401 or can be provided as a separate element thermally coupled to the diode case that cools down portions of or entire diode case.

In summary, by the driving continuous wave-laser diodes, such as conventional DFB laser diodes (e.g., conventional telecom DFB laser diodes), with relatively high-peak-amplitude, relatively short-duration pulses that have a time duration of the order of a time constant of the active region 102, one can effectively sweep a laser diode emission output wavelength over a broad wavelength range. The wavelength range sweep can exceed 10 nm. Such wavelength sweeps can be accomplished over a short period of time that is typically less than 1 μs, or even less than 0.5 μs, or even less than 400 ns, or even less than 250 ns in some embodiments. To allow for continuous operation of laser diodes 401 within such a pulsed regime, low-duty ratio current pulses may be used. This operates to prevent any appreciable rise in average or bulk temperature of the laser diode 401. A typical duty ratio of less than 0.05, or even of less than 0.01, or even less than 0.001 in some embodiments, may be used. Duty ratio is as described in Eqn. 1 above. Furthermore, typical pulse repetition rates of between about 10 KHz and about 100 kHz can be achieved with pulse duration below 1 μs, while using current pulses with amplitudes that typically exceeded the maximum declared continuous DC drive current by 5 times or more, 10 times or more, or even 50 times or more in some embodiments.

In accordance with one or more embodiments of the present invention, a standard telecommunication diode, such as a telecommunication DFB diode, intended for single wavelength operation can be used to provide very fast and high-optical power wavelength sweeps over a wavelength range of greater than 5 nm, greater than 8 nm, or even greater than 10 nm in some embodiments. A standard telecommunication diode can thus be used, according to embodiments of the present invention, in various applications currently requiring much more complex tunable laser sources. Furthermore, the wavelength versus time characteristics of the sweeps can be linearized or otherwise shaped by proper programming of the current pulse amplitude versus time characteristics, i.e., controlling the pulse shape. These very fast and short duration wavelength sweeps can be used for time division multiplexing and other applications requiring both short duration wavelength-swept optical pulses, as well as relatively high-optical power. Optical power of greater than 100 mW is possible, with average optical power being around 60 mW when operated in pulsed mode.

Furthermore, embodiments of the wavelength sweeping apparatus 400 may be used to provide wavelength sweeping in optical sensor interrogation systems that are adapted for the interrogation of spectrally-resolved optical fiber sensors. In particular, optical sensor interrogation systems in accordance with embodiments of the invention may be used on Fiber Bragg Gratings (FBGs), however the principles and systems described further below can be with or without modifications applied to other similar spectrally-resolved optical sensors, such as properly designed fiber Fabry-Perot sensors, Michelson and other interferometers, chemical/biochemical sensors, and the like.

Figure 16:
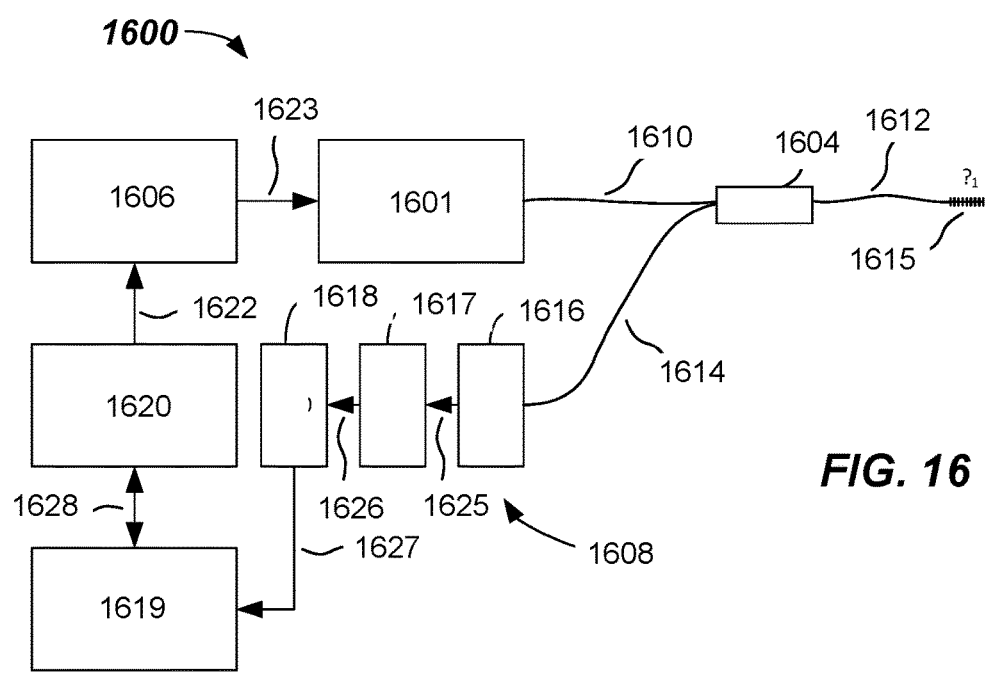
FIG. 16 illustrates a measurement system adapted to interrogating optical sensors (e.g., FBG sensors) according to embodiments.

One optical interrogation system 1600 is shown in FIG. 16 and includes a laser diode 1601 (e.g., a DFB laser diode), a pulse generator 1606 (e.g., a programmable current pulse generator), an optical diverter device 1604, such as a fiber-optic coupler, a circulator, a beam splitter, or similar diversion device, and an optical observation device 1608. The optical observation device 1608 may include an optical receiver 1616 that may further include a photo-detector, a trans-impedance device or amplifier 1617, decision logic device 1618 such as a comparator or limiting-amplifier, a time measures subsystem 1619, such as a time-to-digital converter (TDC), and a processing unit 1620. The optical interrogation system 1600 includes various lengths of optical fiber 1610, 1612, 1614 that optically interconnect the optical interrogation system 1600 with at least one optical sensor 1615, such as a spectrally-resolved optical sensor. One example of a spectrally-resolved optical sensor is a fiber Bragg grating. Other types of optical sensors may be interrogated by the optical interrogation system 1600.

The operation of the optical interrogation system 1600 will now be described in detail. The processing unit 1620 triggers the pulse generator 1606 by signal in electrical line 1622, in order to generate an electrical current drive pulse that drives the laser diode 1601 by the electrical connection 1623, which further generates a short duration optical-pulse that varies its wavelength over time over a wavelength output range. At the time of initially generating the optical pulse, the time measures subsystem 1619 is also triggered through the data line 1624 by the processing unit 1620. The optical-pulse propagates through the length of the optical fiber 1610, the optical diverter device 1604 and the length of optical fiber 1612, until it reaches sensor 1615 (e.g., FBG). The FBG is transparent to all wavelengths except to a characteristic wavelength, which indicates the state of the FBG. As widely-known in the art, a FBG's characteristic wavelength depends on the initially-inscribed period of the FBG, and the concurrent strain and temperature imposed on FBG. In operation of the FBG, a change in strain or temperature causes a shift in the FBG's characteristic wavelength. The FBG thus only reflects-back a narrow part of the incoming pulse that has a wavelength equal to the characteristic wavelength of the FBG. Since pulse-wavelength changes proportionally over time, the time at which the back-reflection from FGB occurs depends on the FBG's characteristic wavelength. The reflected pulse propagates back along the length of the optical-fiber 1612 into the optical diverter device 1604, which then splits part of the incoming light into the section of optical fiber 1614, which is further connected to the optical-receiver 1616. The optical receiver 1616 converts the incoming optical signal into an electrical signal, which travels over an electrical line 1625, to the trans-impedance amplifier 1617 where it is amplified. The trans-impedance amplifier 1617 is further electrically connected by conductor 1626 to the decision logic device 1618 (e.g., a comparator) which may function to compare the amplified electrical pulse at a reference level. The signal at the output of the decision logic device 1618 is a square pulse that further triggers the time measures subsystem 1619 by an electrical connection 1627. The time measure subsystem 1619 determines time $T_0$ between the start of the initial pulse generation and the arrival of the back-reflected pulse to the optical receiver 1616, and sends the result over data the line 1628 to the processing unit 1620. The processing unit 1620 further subtracts from this time $T_0$, a time that is required for the optical pulse to transverse the path from the laser diode 1601 to the sensor 1615 (e.g., FBG) and back to the optical receiver 1616 and the propagation delay $T_{PD}$ generated by the electronic part of the receiving electronics (trans-impedance amplifier 1617, decision logic device 1618, and electrical connections):

$$T_0 - T_{PD} = 2Ln/c \qquad \text{Eqn. 2}$$

where L is the total length of the optical fiber that the pulse travels from the laser diode 1601 to the optical sensor 1615 and back to the optical receiver 1616 (e.g., photodetector), n is the effective group index of the optical-fiber mode and c is the speed of light in a vacuum. The remaining time-difference T is proportional to the difference between the FBG's characteristic wavelength and the initial wavelength $\lambda_0$ of the laser diode 1601 (e.g. at the start of the pulse excitation, which also approximately corresponds to the wavelength that is obtained at nominal current during the continuous wave operation of the laser diode 1601). This remaining time difference T can be linearly proportional to the wavelength difference if the pulse-shaping of the DFB diode drive-current is such as to provide a linear wavelength sweep over time, as described previously. Any change in FBG's state (e.g. change in strain and/or temperature) will thus induce change during the time between initiation of the pulse and its arrival to the optical receiver 1616 of the detection system. The actual characteristic wavelength λ of FBG can be thus calculated as:

$$\lambda = \lambda_0 + T * \Delta\lambda_p / t_p \qquad \text{Eqn. 3}$$

where $\lambda_0$ is the initial laser diode wavelength (wavelength at beginning of the pulse), $\Delta\lambda_p$ is the laser diode wavelength sweep-range, and $t_p$ is the pulse duration.

The present measurement system 1600 converts wavelength measures directly into time measures and thus provides an accurate, stable, repeatable measurements. The conversion of optical wavelength measure into time measures brings several advantages such as the possibilities of using simple and cost-effective measure systems that achieve high-resolution and accuracy at low cost. Such time measure subsystems with picosecond resolution and accuracy may be provided in the form of low-cost integrated circuits, e.g. in the form of a time-to-digital converter (TDC). One TDC example is the integrated circuit TDC-GP21 or TDC-GPX produced by Acam, Germany. For example, at 300 ns pulse duration, a 10 nm total wavelength sweep-range, and a TDC resolution of 10 ps it is theoretically possible to achieve resolution of less than about 1 pm (more precisely about 0.33 pm).

Figure 17:
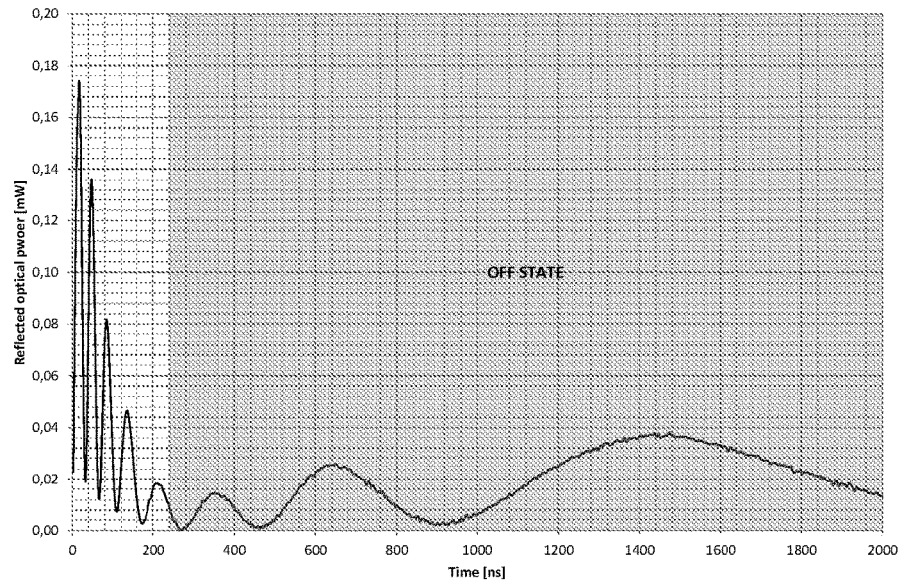
FIG. 17 illustrates a plot of reflected optical power over time of a Fabry-Perot etalon during heating and cooling according to embodiments.

In another method embodiment, a wavelength sweep can be also performed during a cool-down cycle of the active region 102. In this embodiment, a short duration, high-amplitude pulse is generated. The generated pulse may have a time duration of about 300 ns, and an amplitude of about 2 A, for example. This pulse heats up the active region of the laser diode. Immediately after termination of this heating pulse, a relatively lower current is driven through the laser diode to keep the diode lasing during the cool-down phase. The relatively lower current may be typical nominal drive current specified for DC operation of the laser diode, for example. In this embodiment, the cool-down process may generate a temperature sweep of the active region and its vicinity, and consequently the wavelength sweep of the emitted optical power. This allows for acquisition of spectral characteristics of an optical sensor or similar optical device during the cooling of the laser diode, as shown in FIG. 17. It is also possible to achieve a substantially linear cooling process by applying proper control of the laser diode drive current during the cooling-down phase.

Figure 18:
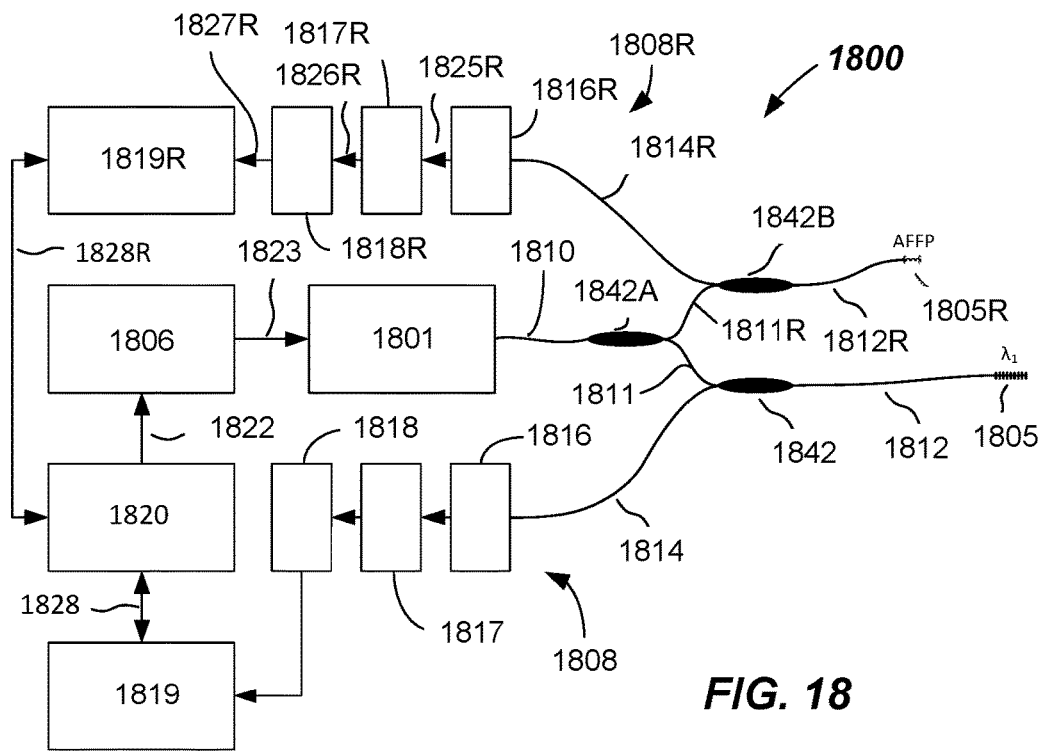
FIG. 18 illustrates a measurement system including a reference adapted to allow wavelength tuning control according to embodiments.

In another embodiment, as shown in FIG. 18, a measurement system 1800 is shown having a wavelength reference in the form of an added all-fiber Fabry-Perot etalon 1805R coupled to the laser diode 1801 to provide for precise wavelength control. The depicted embodiment includes two more optical diverters 1804A, 1804B, such as optical couplers, an additional optical receiver 1816R (e.g., a photodetector), an additional trans-impedance amplifier 1817R, an additional decision logic device 1818R (e.g., a comparator), and an additional input channel on time measures subsystem 1819 (e.g., a TDC) or an additional time measures subsystem 1819R (e.g., a TDC), as shown. When the pulse on the laser diode 1801 is released, both TDC channels (e.g., TDC channels) or time measures subsystems 1819, 1819R are triggered over the electrical connections 1828, 1828R by processing unit 1820. The optical pulse then travels along the optical-fiber 1810 through the first optical coupler 1842A, which then divides the optical pulse into two fiber branches 1811 and 1811R. The pulse further travels along the length of the optical fiber 1811R to the second optical diverter 1842B (e.g., coupler), and at same time along the length of the optical fiber 1811 to the third optical diverter 1842 (e.g., an optical coupler). From the second optical coupler 1842B the pulse propagates along the length of the optical fiber 1812R to the reference all-fiber Fabry-Perot etalon 1805R. The Fabry-Perot etalon back-reflects the incoming pulse, but this back-reflection is wavelength dependent, i.e. periodic according to wavelength. The Fabry-Perot interferometer thus modulates the wavelength-swept pulse into a sinusoidal optical signal, such as the type shown in FIG. 11.

This reflected sinusoidal signal is guided back to the second optical coupler 1842B, which directs part of the reflected pulse power into the optical fiber 1814R that then guides the pulse to the optical observation device 1808R. The optical observation device 1808R may include an optical receiver 1816R, a trans-impedance device or amplifier 1817R, decision logic device 1818R, a time measures subsystem 1819R, and a processing unit 1820.

The optical receiver 1816R converts the optical pulse into an electrical signal that is provided to the trans-impedance amplifier 1817R in electrical line 1825. The trans-impedance amplifier 1817R amplifies the signal and transmits the signal over an electrical connection 1826R to the decision logic device 1818R (e.g., a comparator), which then forms a train of electrical pulses, and further directs them over an electrical line 1827R to the time measure subsystem 1819R (e.g., a TDC), which measures the time intervals between those pulses generated by the decision logic device 1818R.

The time measure subsystem 1819R then sends the measured time-interval via the data line 1828R to the processing unit 1820, which further controls the parameters for the pulse generator 1806 over line 1822. If the time-intervals between the pulses are substantially equal (period of pulses is constant) then the wavelength sweep of the laser diode 1801 is substantially linear. In those cases where the time intervals between pulses are different, the processing unit 1820 adjusts the parameters of the pulse generator 1806 and consequently the current pulse shape, through signals in electrical line 1823 to the laser diode 1801 in order to make these distances amongst the pulses approximately equal. Equalization of the distances amongst these pulses linearizes the wavelength versus time dependence of the emitted wavelength. The wavelength adjusting/linearization system can run independently from the rest of the measurement system 1800, which preserves the acquisition rate of the system. The remainder of the measurement system 1800 operates with an optical observation device 1808. The optical observation device 1808 may include an optical receiver 1816, a trans-impedance device or amplifier 1817, decision logic device 1818, a time measures subsystem 1819, and the processing unit 1820 operating as discussed above for FIG. 16 to interrogate the optical sensor 1805.

Such a measurement system 1800 can achieve improved accuracy over environmental influences such as temperature, since the parameters of the pulse generator 1802 may be continuously or intermittently dynamically adjusted through the use of the reference and the closed feedback-loop to provide linear wavelength sweep of the laser diode 1801.

This measurement system 1800 can be embodied in many different ways. For example, all three diverter devices 1842, 1842A, 1842B, could be, for example, replaced by one 3×3 coupler, but the lengths of optical fiber 1812R should then be sufficiently different from the length of the optical fiber 1812 to prevent reflected pulse overlapping (each reflected pulse that enters the 3×3 coupler is forwarded to all three branches). In another configuration, an all-fiber Fabry-Perot interferometer (AFFP) 1805R could be placed in an in-line configuration with FBG 1805, i.e. along the same fiber line 1812, whilst inserting a proper fiber-delay line between FBG 1805 and AFFP 1805R to separate the back-reflected pulses in time. In the latter case, only one time measures system 1819 can be used. Furthermore, instead of actively adjusting the excitation electrical current pulse's shape, the information on the distances between pulses obtained from reference AFFP 1805R can be used to perform correction (linearization) of the measured results. The AFFP c1805R could also be replaced by a series of FBGs (like 1805), but with different wavelengths for obtaining reference pulses at particular reference wavelengths. However, in that case the additional FBGs should be isolated from environmental changes.

Figure 19:
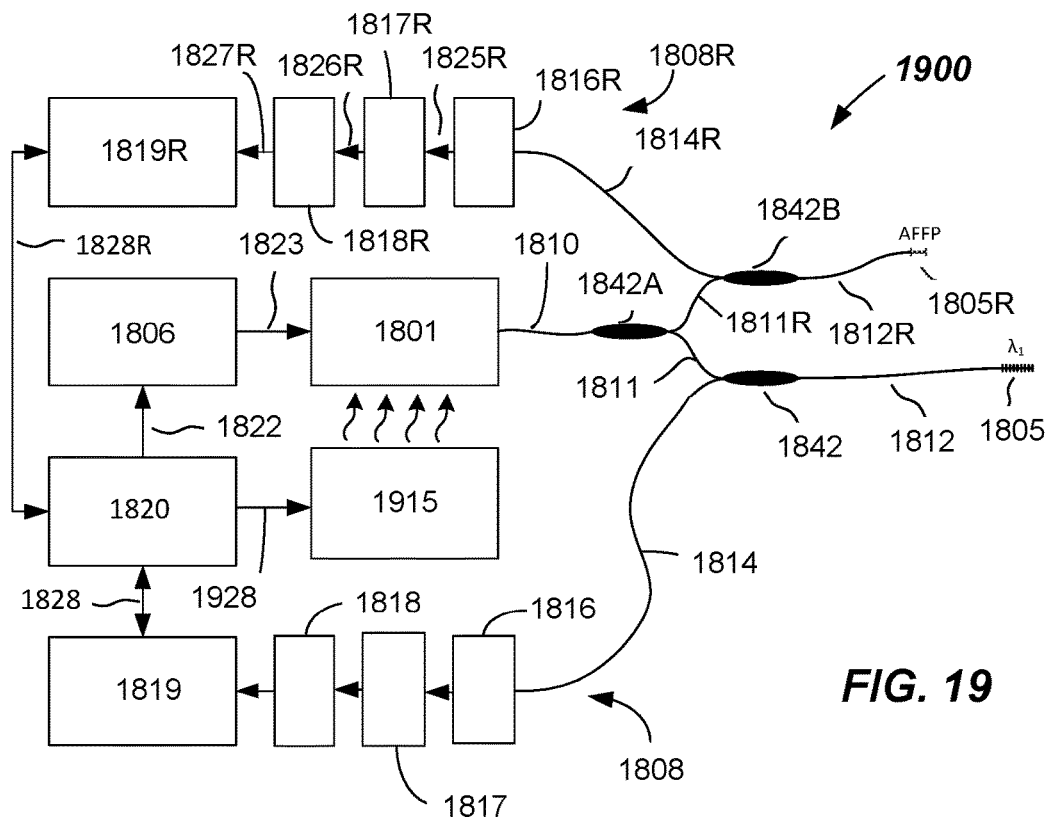
FIG. 19 illustrates a measurement system including thermal cooling according to embodiments.
Figure 20:
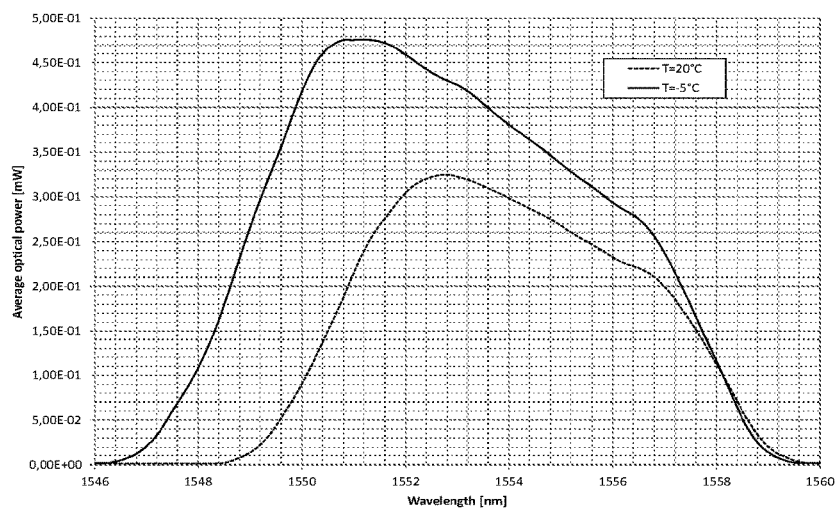
FIG. 20 illustrates a spectral response plot of a laser diode under pulse-excitation at two different temperatures according to embodiments.

Furthermore, external temperature control of the laser diode 1801 can be added to the system of FIG. 18, as shown in the measurement system 1900 of FIG. 19, ether to stabilize the wavelength scanning-range and the initial diode's wavelength and/or to extend the wavelength scanning-range by further reduction of the environmental temperature of the laser diode 1801. For example, laser diode 1801 can be mounted onto a thermoelectric cooler 1915 (either the case of the diode or diode chip), which can then adjust an operational temperature of the diode 1801 via a control signal 1928 from the processing unit 1820. Such a configuration provides the opportunity to decrease an initial operational temperature of the laser diode 1801, which significantly increases the wavelength tuning range of the diode 1801. Reduction of the laser diode chip's temperature increases the temperature span in which the active region temperature can be varied, as previously explained in detail. Lowering the temperature thus extends the active region temperature variation span, which leads to a broader wavelength sweeping-range, as indicated as an example in FIG. 20.

Pulses that produce linear wavelength sweep were first generated by the laser diode 1801 stabilized at a temperature of 20° C. The wavelength sweep span was, in this case, approximately 8 nm. Afterwards, the laser diode 1801 was cooled, while simultaneously increasing the pulse duration. Lowering of the laser diode temperature requires a simultaneous increase in pulse duration and/or amplitude in order to achieve a prolonged wavelength sweep-range. In the particular example shown in FIG. 20, the wavelength-sweep of the laser diode 1801 was extended by cooling the diode to −5° C., while simultaneously extending the pulse duration from 300 ns to 600 ns the electrical current amplitude remaining the same as at 20° C. In such a case the wavelength sweep span increased by more than 2 nm, to over 10 nm, an approximately 20% increase.

Figure 21:
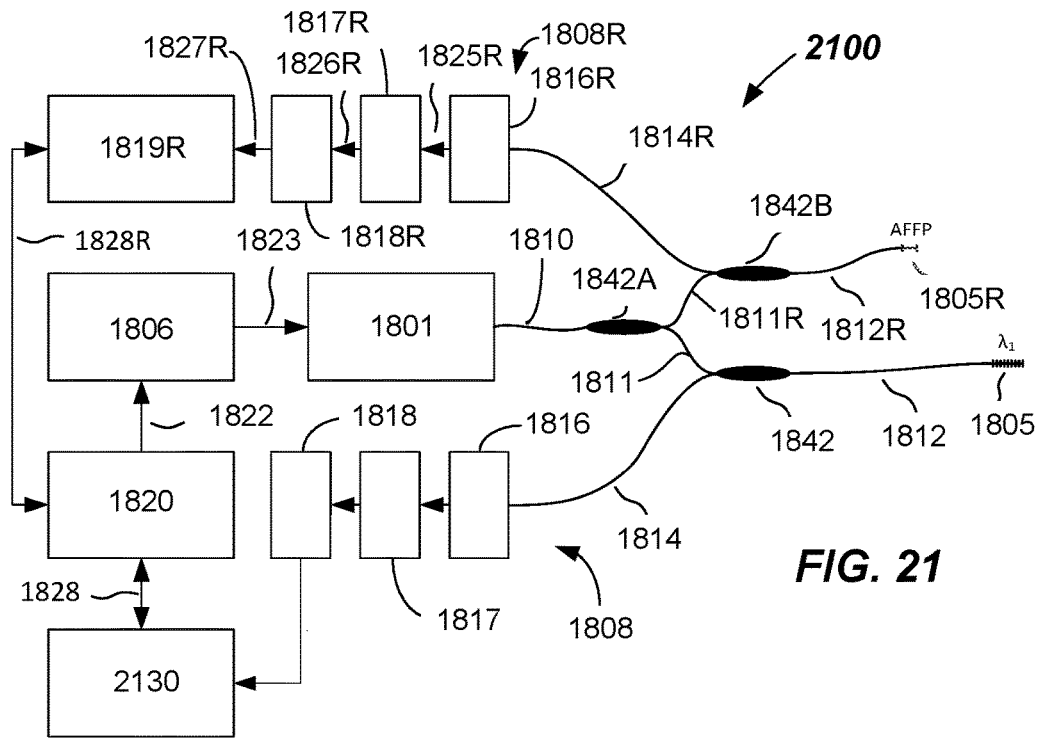
FIG. 21 illustrates a measurement system including an analog-to-digital converter (ADC) instead of time-to-digital converter (TDC) according to embodiments.

In another embodiment, the time measures subsystem 1619, 1819 (e.g., a time-to-digital converter (TDC)) may be replaced by a high-speed analog-to-digital-converter 2130 as shown in FIG. 21. High-speed analog-to-digital-converters are widely available at low-cost and can easily acquire data at rates of more than 500 Msps. At this rate, for example, the processing unit 1820 can record approximately 100 samples during a 200 ns pulse duration. From the recorded samples it is possible to fully reconstruct the spectral characteristic of the optical sensor 1805 and/or the reference sensor 1805R using conventional approximation and interpolation methods. Conventional processors can be replaced by field-programmable gate array (FPGA) or a similar circuit, which could further improve the performance of such a measurement system. Such an embodiment can provide the possibility of acquiring full spectral characteristics of the sensor 1805 by a precise timer recording of the signals generated by the wavelength sweep, which is particularly useful during the integration of more complex spectrally resolved sensors or sensor systems, where peak wavelength observation/determination is insufficient or when the spectral characteristics of the sensor or system take more complex shapes that need to be further analyzed.

Figure 22:
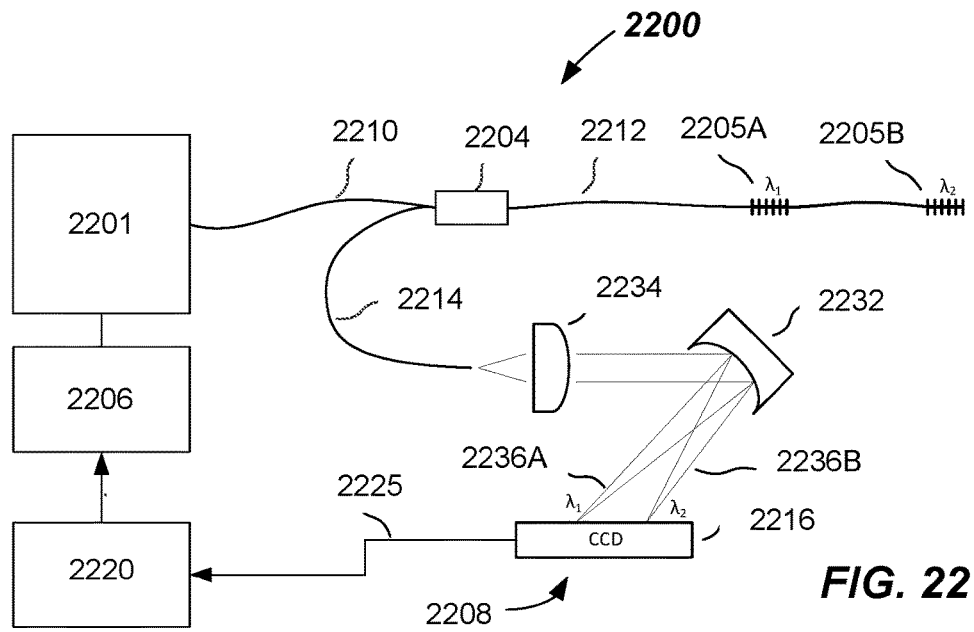
FIG. 22 illustrates a measurement system including wavelength selective elements according to embodiments.

In another embodiment, the optical wavelength sweeping apparatus can be used to replace a broad-band optical source such as a superluminescent light emitting diode (SLED). In this embodiment, the bandwidth of the optical detection or measurement system 2200 should be (significantly) below the inverse value of the excitation pulse duration in order to allow for averaging of the incoming optical signals. One embodiment of the measurement system 2200 is shown in FIG. 22. The measurement system 2200 utilizes a wavelength dispersive element 2232 in the form of a diffraction grating or prism as part of the optical observation device 2208. A wavelength swept light pulse from the laser diode 2201 (e.g., a DFB laser diode) driven by a current pulse generator 2206, travels along an optical fiber 2210 through the optical diverter 2204 (e.g., an optical coupler) and the length of the optical fiber 2212 to a plurality of sensors 2205A, 2205B, for example. The optical sensors 2205A, 2205B may be two or more fiber Bragg gratings each with a different initial wavelength wherein the sensors 2205A, 2205B respond by reflecting back two narrow pulses of light that corresponds to the FBG characteristic wavelength of each sensor 2205A, 2205B. Other sensor types may be interrogated as well.

The reflected pulses are traveling back through optical diverter 2204 where part of reflected pulses are divided into the optical fiber 2214, which may have be flat cleaved at an end thereof. Both light pulses leave the optical fiber 2214 at the flat cleaved end and travel through a collimating lens 2234 which collimates the light beam. The two pulses of light further travel to the diffraction grating 2232 where each pulse is diffracted at a different angle 236A, 2236B in respect to their wavelengths. In this manner, the light pulses are received at a specific position on an optical receiver 2216, which may be a linear detector array (e.g., a CCD array). The collimating lens 2234, diffraction grating 2232, optical receiver 2216 together make up the observation device 2208. The acquired data signals are sent to the processing unit 2220 via the data line 2225. Suitable conversion, filtering and/or amplification of the data signals may be provided. The processing unit 2220 can then calculate the wavelength peak positions of the sensors 2205A, 2205B (e.g., FBGs) from the known geometric parameters between the wavelength dispersive element 2232 and the optical receiver 2216 (e.g., a linear detector array). In this embodiment, a linearization of the wavelength sweep is not necessary, since the spectrum of reflected light is directly correlated to the measured parameter. In this embodiment, the pulse generator 2206 and DFB laser diode 2201 comprise an optical wavelength sweeping apparatus that effectively replaces the broadband optical source that is usually required in such systems.

Furthermore, the wavelength-swept, short duration, high amplitude optical pulses generated by the optical wavelength sweeping apparatus of the present invention are ideally suited for use in time multiplexed spectrally resolved sensor measurement systems, such as those that use multiple FBGs system or FBG arrays.

Figure 23:
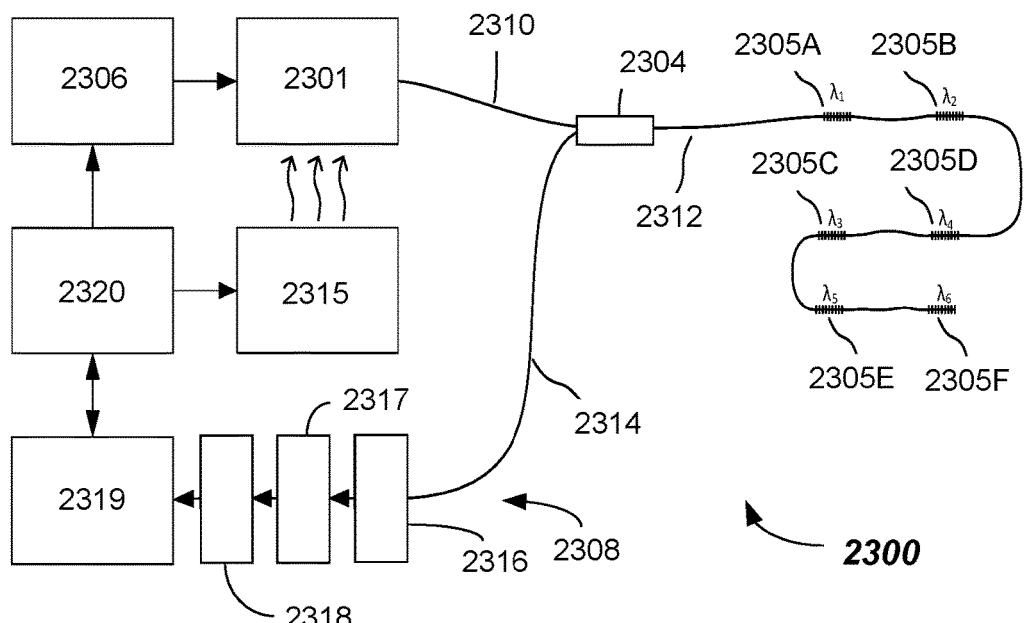
FIG. 23 illustrates a measurement system for a fiber Bragg grating (FBG) array according to embodiments.

In an embodiment shown in FIG. 23, multiple optical sensors 2305A-2505F (e.g., FBGs) with different characteristic wavelengths can be located arbitrarily close to one another along the same optical fiber 2312. When an optical pulse that exhibits a varied wavelength over time arrives at such an array of sensors 2305A-2305F, each individual sensor 2305A-2305F will reflect back different parts of the incoming optical pulse, thus multiple back-reflected optical pulses will be generated. The arrival times of each optical pulse consequently represent the characteristic wavelengths of each individual sensor 2305A-2305F (e.g., FBG). This operational regime is well-suited in particular for strain and strain-related measurements (e.g. force, torque, or the like) as a pair of gratings can be configured in such a way as to exhibit the same temperature influence but different responses to the strain or other parameters that can be converted to the strain.

In this embodiment, the time differences between arriving pulses from the laser diode 2301, reflected by each sensor 2305A-2305F (e.g., FBG) can be measured to determine strain-induced change, while the total travel time measured from the pulse generator 2306 until the arrival of the pulses to the observation device 2308 can be correlated to the strain and the temperature influence, which allows for simultaneous measures of strain and/or temperature. The measurement system 2300 described herein may be used in other ways known in the art, that allow for the usage of grating pairs to measure specific target parameters, while canceling out all other influences of paired FBGs.

In many such embodiments, one grating may act as a reference while the other may act as a sensor. However, other possible configurations are possible. For example, one grating, may expand whilst the other contracts under a particular measured parameter while all other environmental parameters influence both gratings simultaneously. Accordingly, the direct observation of characteristic wavelength differences provides an excellent way of canceling out unwanted environmental influences. The present measurement system 2300 is well-suited for such sensor measurements since the time measure subsystem 2319 must only be reprogrammed for measuring time delays between pairs of back-refracted pulses generated by closely spaced pairs of gratings. The other structure of the measurement system 2300 is as before described in FIG. 16 and FIG. 19 including optical fibers 2310, 2314, optical diverter 2304 (e.g., optical coupler), and observation device 2308 including optical receiver 2316 (e.g., a photodetector), amplifier 2317, logic device 2318 (e.g., a comparator), time measures subsystem 2319 (e.g., a time-to-digital converter (TDC)), and a processing unit 2320. The measurement system 2300 may include active cooling by thermally coupling the laser diode 2301 to a cooling device 2315 such as a thermoelectric cooler.

Figure 24:
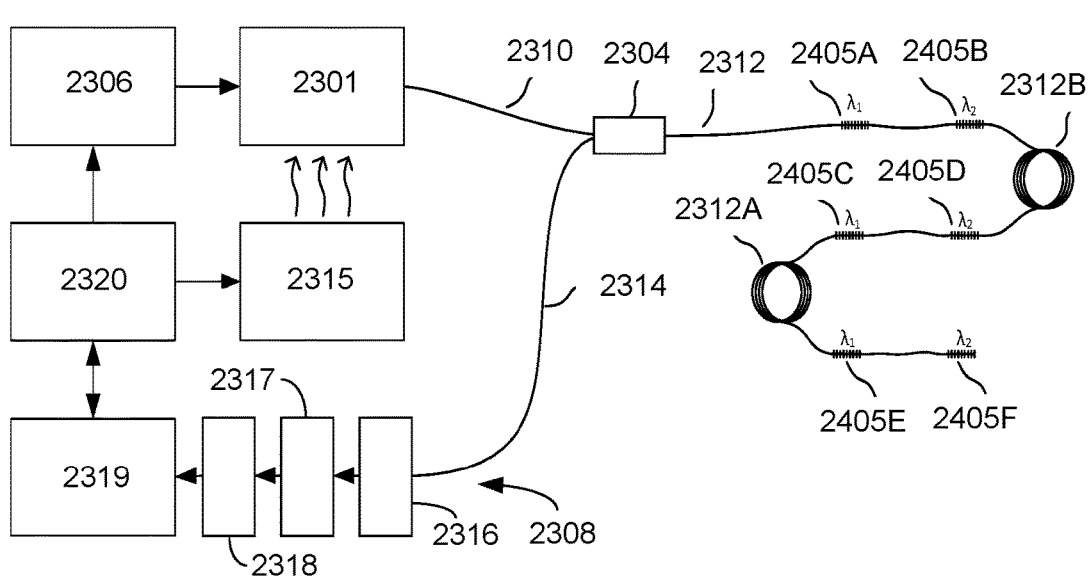
FIG. 24 illustrates a measurement system for a FBG array using time multiplexing according to embodiments.

In one or more other embodiments, the measurement system 2300 is ideally suited for the time-domain multiplexing of optical sensors. In this embodiment, spacing between individual fiber Bragg gratings (FBGs) 2405A-2405F should be large enough to prevent potential overlapping of back reflected pulses, as shown in FIG. 24. The sensors 2405A-2405F (e.g., FBGs) may cover equal or very similar operational wavelength ranges, but sufficient lengths of optical fiber 2412A, 2412B may be inserted in-between the sensor pairs to prevent pulse overlapping. For example a "safe" distance D between two FBGs that have the same spectral characteristics is determined by generated optical pulse duration T and can be estimated as:

$$D = (c/n) * T/2 \qquad \text{Eqn. 4}$$

where c is the vacuum speed of light and n is the effective group index of the fiber mode. If the pulse duration is, for example, 300 ns, the distance between the two gratings with equal initial wavelengths should be about at least 30 m. Time-division multiplexed FBGs should also have relatively low reflectivity and good transmittance to prevent large losses of optical power. In this case, the processing unit 2320 triggers time measures subsystem 2319 (e.g., a TDC) at an appropriate time to acquire pulses back-reflected by the observed FBG pair. For example, if the length of fiber 2412 is 100 m, the length of fiber 2412A is 200 m, and the pulse duration is 300 ns, the processing unit 2320 should trigger time measures subsystem 2319 with a 3 μs delay, for example, to allow through the reflected signals from the first two sensor 2405A, 2405B and to acquire time-difference between the reflected optical signals from the FBGs 2405C, 2405D. In order to acquire time-difference between the FBGs 2405E, 2405F, processing unit 2320 should trigger a time measures subsystem 2319 with a 6 μs delay, for example. Other time delays and fiber lengths may be used.

By combining the fast wavelength-sweep achieved by the optical wavelength sweeping apparatus for the interrogation of FBGs with different characteristics' wavelengths and time division multiplexing as described above, it becomes possible to create relatively larger sensor networks, which include numerous optical sensors and can cover long distances amongst individual sensors. By using several optical sources at different emitting wavelengths, such measurement systems may be further expanded.

Figure 25:
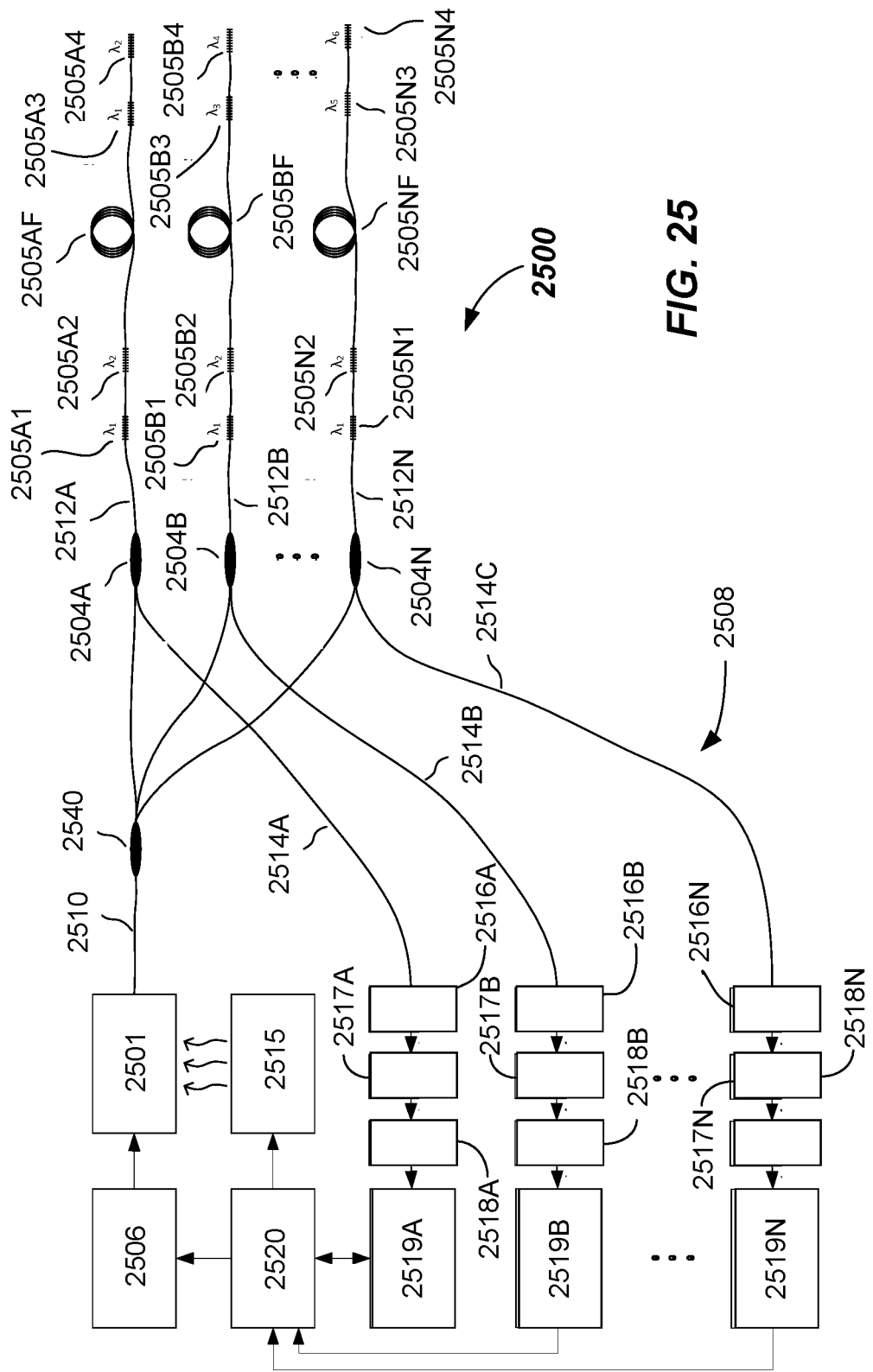
FIG. 25 illustrates a measurement system for an array of optical sensors using a 1×N optical coupler according to embodiments.

Due to the relatively large optical power generated by the laser diode when driven in a pulsed mode as described herein, a significant extension of the sensor count (a number of sensors coupled to the measurement system) is possible. As shown in FIG. 25, a measurement system 2500 includes an additional multiport diverter device 2540 (e.g., a multiport coupler such as a 1×N coupler), N 1×2 couplers 2504A-2504N, N optical fiber branches 2512A-2512N containing optical sensors 2505A1-2505N4, N optical receivers 2516A-2516N, N trans-impedance amplifiers 2517A-2517N, N decision logic devices 2518A-2518N (e.g., comparators), and N time measures systems 2519A-2519N (e.g., time-to-digital converters or channels of a time-to-digital converter). Once a high-power pulse is generated by the pulse generator 2506 and sent to the laser diode 2501, the short duration, high amplitude pulse travels along the length of the optical fiber 2510 into a 1×N optical diverter 2540, which distributes optical pulses in N optical diverters 2504A-2504N through the lengths of the optical fibers 2510A-2510N.

The optical diverters 2504A-2504N operate to distribute light pulses into the N branches formed by the lengths of optical fiber 2512A-2512N. Each branch contains a number of optical sensors 2505A1-2505A4 through 2505N1-2505N4. The number of optical sensors in each branch is limited by the wavelength sweep range of the laser diode 2501 as driven by the pulse generator 2506 if the optical sensors have different initial wavelengths or by produced optical power if time domain multiplexing is used. If time domain multiplexing is used, it is desired to ensure sufficient length of optical fibers 2512AF-2525NF between the optical sensors with equal spectral properties to prevent overlapping of the back-reflected optical signals. The reflected optical signals on each branch travel back to the N 1×2 optical diverters 2504A-2504N which redirect the reflected optical signals to the optical fibers 2514A-2514N, which are further connected onto an observation device 2508 having the N optical receivers 2516A-2516N. Each optical receiver 2516A-2516N converts optical signals into electrical signals, which are further amplified by the trans-impedance amplifiers 2517A-2517N 7A-7C and compared with a reference level using the decision logic devices 2518A-2518N (e.g., comparators), which further produce square electrical pulses with the same duration (lengths) as the optical signals received. Each signal from the decision logic devices 2518A-2518N is sent an appropriate channel of the time measures subsystems 2519A-2519N. If there are insufficient time measure channels available in a TDC, additional TDCs can be included within the measurement system to cover all optical branches. This configuration allows for the interrogation of N optical branches simultaneously, which increases the system dynamic performance and/or sensor count. Processing unit 2520 and cooling device 2515 are as previously described.

Figure 26:
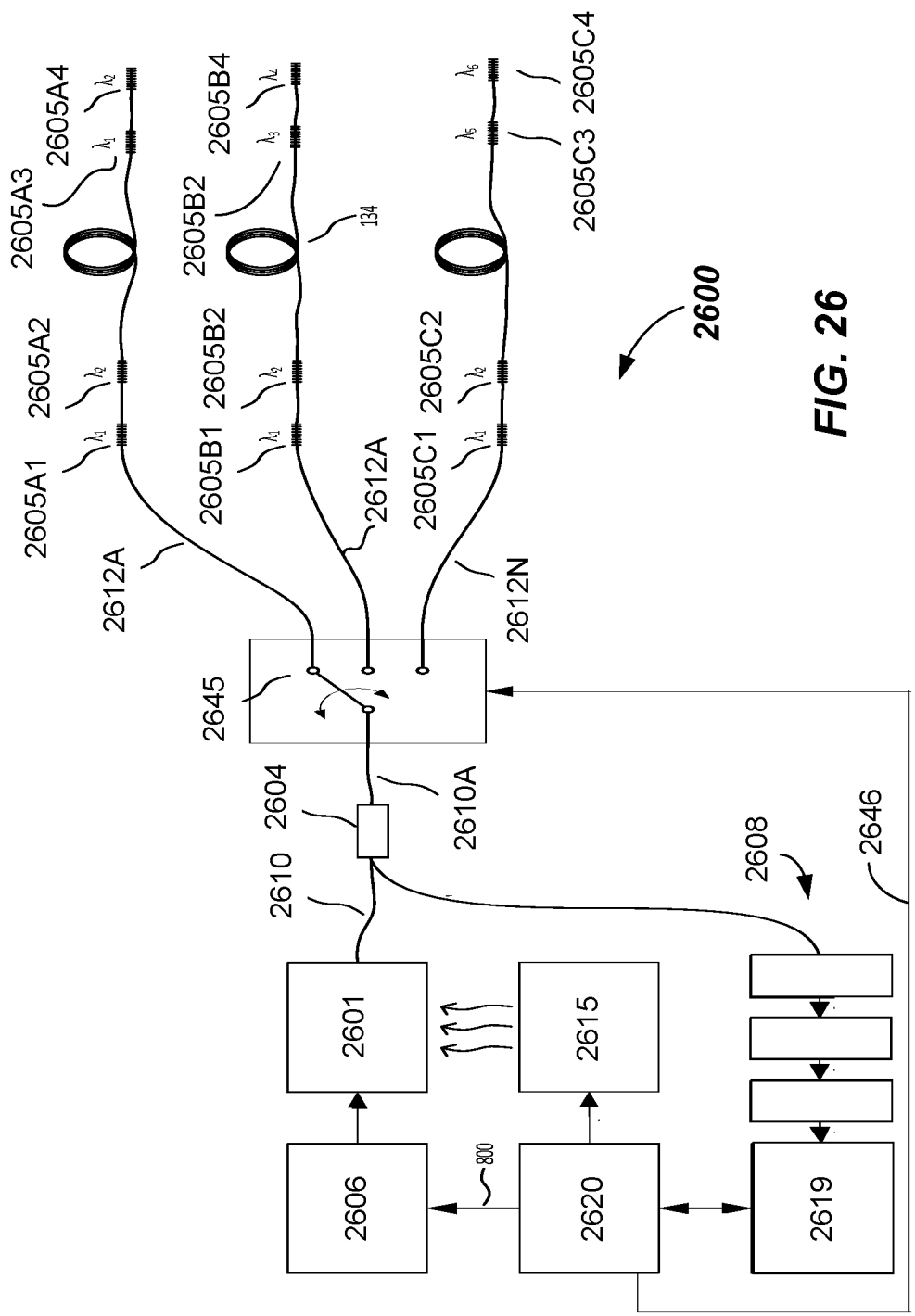
FIG. 26 illustrates a measurement system for an array of optical sensors using an optical switch according to embodiments.

Another multichannel embodiment of a measuring system 2600 is shown in FIG. 26 including an optical switch 2645 instead of the 1×N coupler 2540 used in the embodiment of FIG. 26. After an optical pulse driven by the pulse generator 2606 and generated by the laser diode 2601 is released into the length of the optical fiber 2610, it then travels through the optical diverter 2604 and the length of the optical fiber 2610A to the optical switch 2645. Herein the optical switch 2645 switches between the different optical branches including optical fibers 2612A-2612C and optical sensors 2605A1-A4 through 2605C1-C4. Each optical branch reflects back the optical signals from the optical sensors 2605A1-A4 through 2605C1-C4 to the optical switch 2645 through the length of the optical-fiber 2610A, through the optical diverter 2604 and the length of the optical fiber 2614 into the optical receiver 2616 (e.g., a photo-detector). Optical receiver 2616 further converts the optical signals into electrical signals, as described before, and sends them to the time measures subsystem 2619, which calculates the time delay that is correlated to the measured parameter by the processing unit 2620. The optical system 2600 in this configuration can only interrogate one branch at a time via a switch signal in line 2646 to the switch 2645, but does not require additional signal processing components such as photo-detectors, amplifier, and comparators, and TDCs for each channel, as in previous examples. The remainder of the system 2600 is as previously disclosed in the other embodiments.

The above descriptions relate to FBG sensor interrogation. Embodiments of the present method can be, however, adopted for the interrogation of other spectrally-resolved sensors, such as Fabry-Perot sensors. For example, in the basic system configurations presented in FIG. 14 through FIG. 18, FBGs can be directly replaced by those Fabry-Perot sensors that have spectral characteristics that can be resolved by available wavelength sweep ranges. Other types of optical sensor may be interrogates by the measurement systems described herein.

REPRESENTATIVE EXAMPLE

Figure 14:
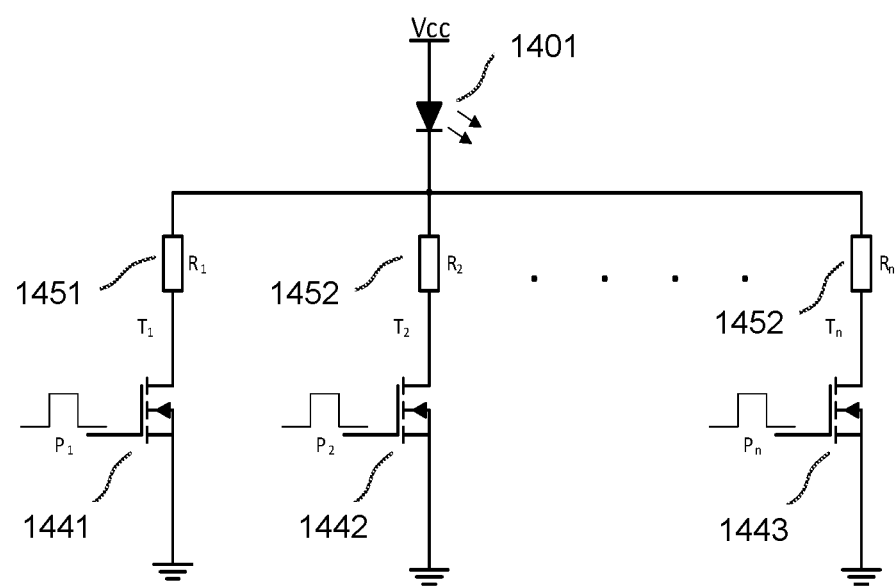
FIG. 14 illustrates a circuit for discrete pulse-shaping according to embodiments.
Figure 27:
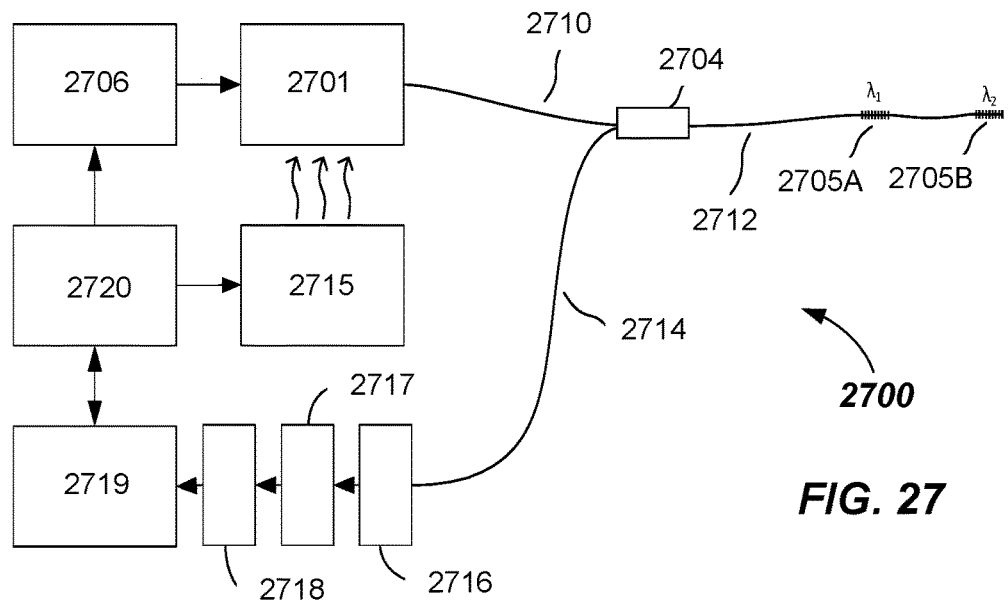
FIG. 27 shows an experimental setup of a measurement system measuring multiple optical sensors according to embodiments.

An example experimental measurement system as is shown in FIG. 27 was used to obtain actual experimental data. The measurement system 27 was constructed from a programmable pulse generator 2706 using a chain of eight transistors, as shown in FIG. 14, a standard telecommunication DFB laser diode 2701 (Osemos model OSMLDP-D513BF2G), and a cooling device 2715 that was a thermoelectric cooler to adjust the temperature of the laser diode 2701. The observation device 2708 included a processing unit 2520 in the form of a microcontroller, a time measures subsystem 2719 such as a time-to-digital converter type TDC-GP21 (produced by ACAM, Germany), a trans-impedance amplifier 2717, a decision logic device 2618, such as a comparator, an optical receiver 2716 such as a photodetector. The optical system included an optical diverter 2704 such as an optical coupler, respective lengths of optical fiber 2710, 2712, 2714 at each branch of optical diverter 2704, and two optical sensors 2705A, 2705B such as FBGs having two different initial wavelengths.

Both Fiber Bragg gratings within experimental measurement system setup were positioned 20 cm apart along the optical fiber 2712, and were fixed on the surface of thin metal plate where one sensor 1705A was fixed on the top side and the second sensor 2705B was fixed on the bottom side of the plate, but with both of them were substantially fixed in parallel directions on the plate. Bending of the metal plate thus caused one sensor 2705A to expand and the other sensor 2705B to compress, which led to a double bend sensitivity of the measurement system 2700 while eliminating those environmental parameters on the measure that did not relate to the bending of the plate (like for example temperature).

Figure 28:
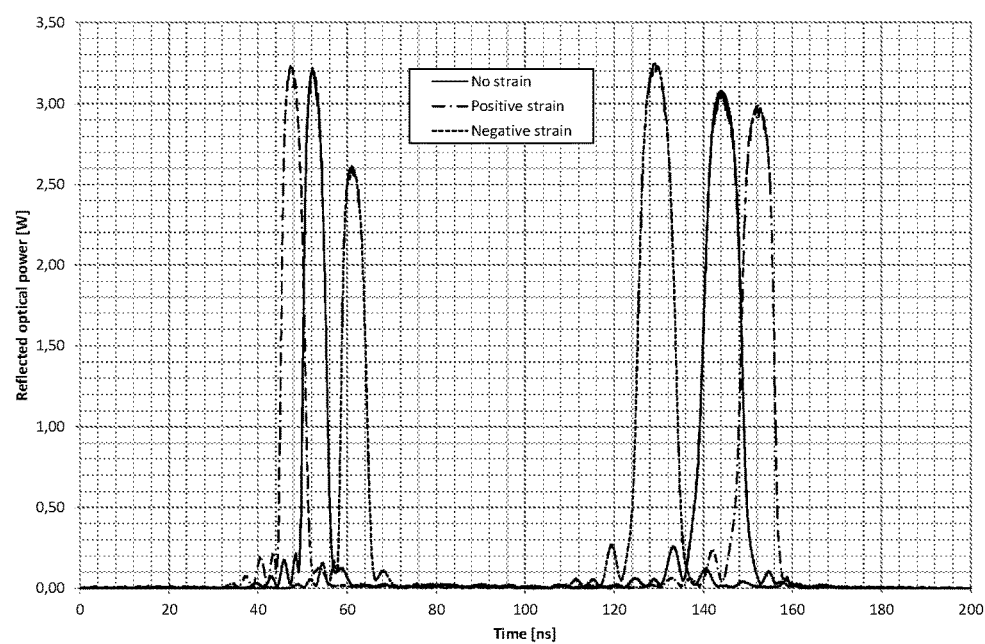
FIG. 28 shows a plot of a change of time difference for a FBG strain change according to embodiments.

In operation, the pulse generator 2706 generated 300 ns long electrical pulses that drove the laser diode 2701 (e.g., a DFB laser diode). The current versus time characteristics of the electrical pulse was set experimentally so as to produce optical pulses to provide a substantially linear wavelength sweep over time. The optical pulse further traveled along the optical fibers 2710 and 2712 through the optical diverter 2704 to the first sensor 2705A. Part of pulse that matched the characteristic wavelength of the first sensor 2705A was reflected back, while the rest of the pulse traveled on to the second sensor 2705B through the fiber 2712. The other part of the pulse, matching the characteristic wavelength of the second sensor 2705B, was also reflected back. Both back-reflected optical pulses were separated over time to values that were proportional to the FBG's characteristics' wavelength differences and the actual distances between both gratings. Since the wavelength sweep of the laser diode 2701 was approximately linear, any change in characteristics' wavelength differences amongst both FBGs linearly correlates with a change in time difference between the arrival times of both reflected pulses. FIG. 28 illustrates recorded pulses when the detection system 2716-2719 was replaced by a high-speed optical oscilloscope to record the arriving optical pulses. When the thin metal plate was bent in one direction, the pulses moved apart over time, while bending of the plate in another direction causes both pulses to arrive with smaller time-delays.

Figure 29:
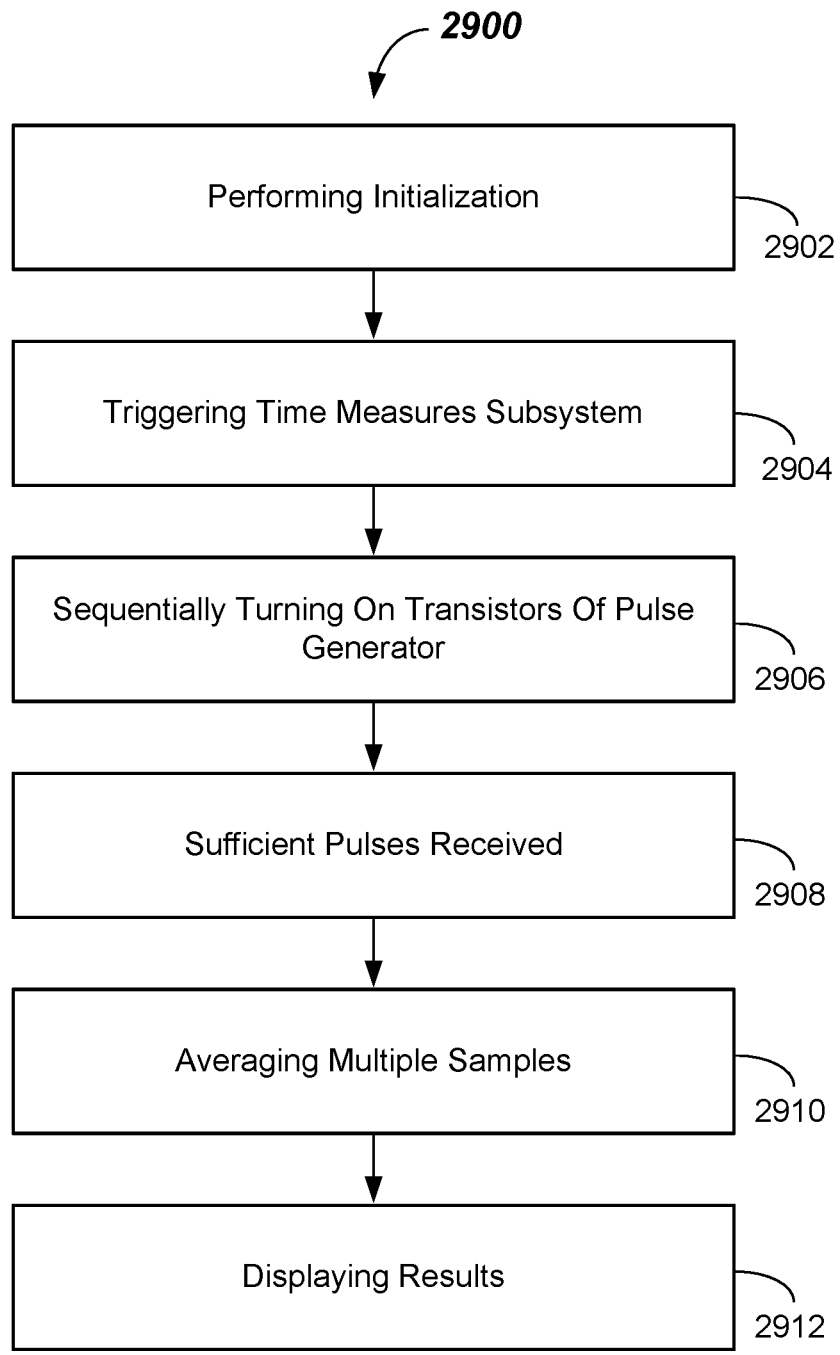
FIG. 29 illustrates a flowchart of method according to embodiments.

An example of a method of operation of the electronic part of a measurement system 2700 (e.g., a sensor interrogation system), in one or more embodiments, may be presented by the method 2900 shown in FIG. 29. The method 2900 is executed by the processing unit (e.g., 2720). Initially, processing unit 2700 and periphery required for the control of pulse generator 2706 and time measure subsystem 2700 is initialized 2902. Initialization may also include temperature stabilization of the laser diode 2701, which is performed by thermal control algorithm executing in the processing unit 2720 wherein a measured temperature is measured against a threshold, for example. In present example, the temperature of laser diode 2701 was decreased and stabilized at −5° C., which allows for wavelength sweeps of over about 10 nm.

After initialization of measurement system 2700 and adjusting temperature of laser diode 2702, the measurement system 2700 starts to measure a time difference between the two reflected light pulses that have been reflected from the sensors 2705A, 2705B. To achieve that, processing unit 2720 may be set in an alert state, where the time measurement subsystem 2719 (e.g., TDC) may be triggered in 702 by an incoming pulse to perform time measurement. Furthermore, processing unit 2720 starts to generate current pulse by sequentially turning on transistors (e.g., MOSFET transistors) of the pulse generator 2706, which define total current flowing through laser diode 2701. After all MOSFETs are turned on, processing unit 2720 may turn all transistors to an off state which ends pulse generation. After the optical pulse generated by the laser diode 2701 is sent into the optical system comprising the two optical sensor 2705A, 2705B, the time measurement subsystem 2719 (e.g., TDC) may wait for a sufficient number of pulses to be received (e.g., two pulses for two sensors) in 2708 that have been reflected from optical sensors 2705A, 2705B. After the two pulses arrive to the time measurement subsystem 2719 (e.g., TDC), internal logic of time measurement subsystem 2719 may measure a time difference between those respective pulses. This difference may be forwarded to the processing unit 2720. Processing unit 2720 may continue to receive data and may, for example, average the measured time delays (differences) in 2910. Numerous time difference samples may be received for averaging, such as a 100 samples. Other numbers of samples may be used. Furthermore, the processed results may be stored in memory and the results may be displayed in 2912, such as on a suitable screen display or printout, which can visually present the result, for example in the form of a time chart.

The measured time difference is converted into a measured parameter by the processing unit 2720 using known wavelength versus time correlation methods. In this particular embodiment, the correlation corresponded to 30 pm/ns. More precisely, before conversation of the measured time difference to a wavelength difference, the time required to travel the distance between both FBGs is further subtracted, as already explained in the previous section.

Figure 30:
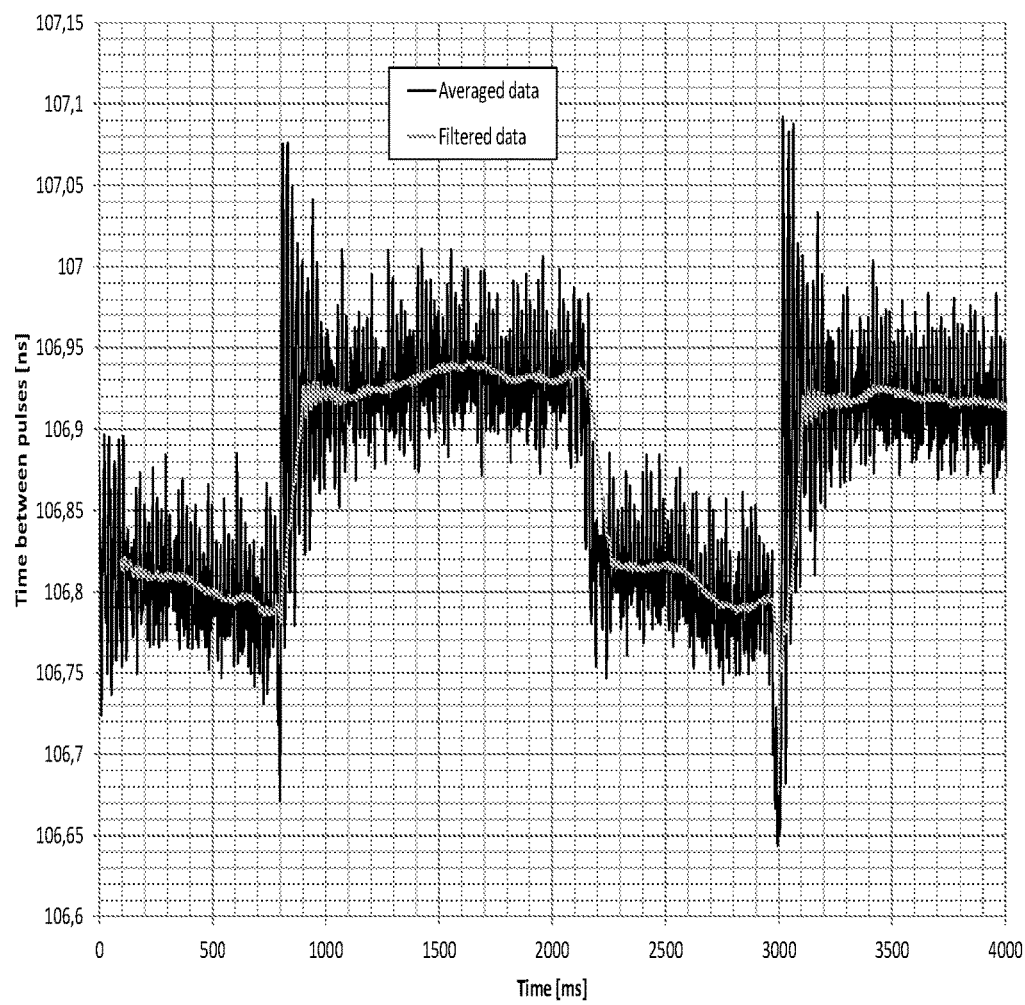
FIG. 30 shows averaged and further filtered recorded data according to embodiments.

A thin metal plate was strained using known weights and the results were observed. A sample rate of 30 ksps was achieved using the experimental measurement system 2700, with the results shown in FIG. 30. The results were averaged to reduce the measurement system bandwidth down to 3 kHz, which additionally increased the system resolution. As seen from FIG. 30, the time difference between the pulses changed for 125 ps when the plate was strained in such a way as to induce the FBGs wavelength shift by approximately 4 pm. The resolution can be further increased by additional filtering, as shown on FIG. 30. Here, the system bandwidth was limited to 300 Hz, which can improve spectral resolution to below 1 pm.

In summary, embodiments of the present methods and systems described herein utilize driving high-amplitude, short current pulses through the active region of a laser diode (e.g., a DFB laser diode) to rapidly raise or decrease a temperature of the active region. Since laser diodes are generally designed for the constant DC operation, a diode's life-time when driven under high-amplitude, short current pulses conditions might be of concern. To test the lifetimes of laser diodes under such conditions, several laser diodes of type OSMLDP-D513BF2N by Osemos, China, were exposed to pulses of 250 ns in length, a current amplitude of 2 A, and a repetition rate of 10 kHz. The laser diodes were continuously tested for over 6000 hours and no detectable damage occurred. Accordingly, such a test has proved that the present methods and systems described herein may be suitable for various applications where low-cost, broad and/or high-speed wavelength sweeps are required.

While the invention is susceptible to various modifications and alternative forms, specific embodiments and methods thereof have been shown by way of example in the drawings and are described in detail herein. It should be understood, however, that it is not intended to limit the invention to the particular apparatus, systems or methods disclosed, but, to the contrary, the intention is to cover all modifications, equivalents and alternatives falling within the scope of the invention.

What is claimed is:

1. A method of driving a laser diode, comprising:
providing a laser diode having an active region including a thickness of less than 1 µm, an active region cross-section of less than 7 µm², and a ratio of active region volume to total laser diode volume of less than 1/300; and
selectively and rapidly heating the active region and immediate vicinity by applying a current pulse to provide a peak increase in temperature of the active region and immediate vicinity of 30° C. or more at an end of the current pulse and to perform a wavelength sweep of emitted optical radiation which is greater than 5 nm.

2. The method of claim 1, wherein the laser diode is a telecommunication distributed feedback laser diode.

3. The method of claim 1, wherein the selectively and rapidly heating comprises applying a current pulse amplitude of greater than about five times larger than a maximum declared continuous DC drive current of the laser diode.

4. The method of claim 1, wherein the selectively and rapidly heating comprises application of a short-duration current drive pulse having a pulse duration of less than 50 µs, less than 10 µs, less than 5 µs, less than 2 is, less than 1 µs, or less than 500 ns.

5. The method of claim 1, wherein an amplitude and pulse duration of the current pulse applied to the laser diode is sufficiently high to provide a peak increase in temperature of the active region of at least 40° C. at an end of a duration of the current pulse.

6. The method of claim 1, wherein an amplitude and pulse duration of the current pulse applied to the laser diode is sufficiently high to provide a peak increase in temperature of the active region of at least 50° C. at an end of a duration of the current pulse.

7. The method of claim 1, wherein an amplitude and pulse duration of the current pulse applied to the laser diode are selected to provide peak optical power at an output of the laser diode that is five times or more higher than when driven by a declared nominal continuous DC drive current.

8. The method of claim 1, wherein the selectively and rapidly heating comprises application of the current pulse having changing amplitude over a duration of the current pulse.

9. The method of claim 8, wherein the current pulse comprises an amplitude change of greater than 25%.

10. The method of claim 1, wherein the wavelength sweep of emitted optical radiation comprises a substantially linear wavelength change versus time.

11. The method of claim 1, wherein a duty ratio of current pulses applied to the laser diode are less than 1/10, less than 1/30, less than 1/100, or less than 1/1,000.

12. The method of claim 1, comprising completing a wavelength sweep in less than about 50 µs, less than 500 ns, less than 250 ns, or less than 100 ns.

13. The method of claim 1, wherein the wavelength sweep comprises a wavelength range of greater than about 8 nm, or greater than about 10 nm.

14. The method of claim 1, wherein the wavelength sweep comprises a wavelength range of greater than about 10 nm in less than about 300 ns.

15. The method of claim 1, wherein the wavelength sweep comprises a wavelength range of between about 1548 nm and about 1560 nm.

16. The method of claim 1, wherein the selective and rapid heating prevents a rise in an average bulk temperature of the laser diode above 30° C.

17. The method of claim 1, wherein the selective and rapid heating prevents a rise in an average bulk temperature of the laser diode above 10° C.

18. An optical wavelength sweeping apparatus, comprising:
a laser diode having an active region including a thickness of less than 1 µm, an active region cross-section of less than 7 pmt, and a ratio of active region volume to total laser diode volume of less than 1/300; and
a pulse generator coupled to the laser diode configured and operable to provide a current drive pulse to the laser diode to selectively and rapidly heat the active region and immediate vicinity to provide a peak increase in temperature of the active region and immediate vicinity of 30° C. or more at an end of the current pulse and to perform a wavelength sweep of emitted optical radiation which is greater than 5 nm.

19. The optical wavelength sweeping apparatus of claim 18, wherein an amplitude and pulse duration of the current pulse applied to the laser diode is sufficiently high to provide a peak increase in temperature of the active region of at least 40° C. at an end of a duration of the current pulse.

20. The optical wavelength sweeping apparatus of claim 18, wherein an amplitude and pulse duration of the current pulse applied to the laser diode is sufficiently high to provide a peak increase in temperature of the active region of at least 50° C. at an end of a duration of the current pulse.

21. The optical wavelength sweeping apparatus of claim 18, wherein an amplitude and pulse duration of the current pulse applied to the laser diode is sufficiently high to provide a peak increase in temperature of the active region of at least 70° C. at an end of a duration of the current pulse.

22. The optical wavelength sweeping apparatus of claim 18, comprising multiple laser diodes with different initial wavelengths and/or wavelength spans.

23. The optical wavelength sweeping apparatus of claim 18, comprising a reference sensor coupled to the laser diode configured and operable to provide wavelength control.

24. The optical wavelength sweeping apparatus of claim 18, comprising a cooler thermally coupled to the laser diode.

25. An optical system configured to interrogate an optical sensor, comprising:
a laser diode having an active region, wherein the active region comprises a thickness of less than 1 µm, an active region cross-section of less than 7 pmt, and a ratio of active region volume to total laser diode volume of less than 1/300;
a pulse generator operably coupled to the laser diode and configured to provide a current drive pulse to the laser diode to selectively and rapidly heating the active region and immediate vicinity to provide a peak increase in temperature of the active region and immediate vicinity of 30° C. or more at an end of the current pulse and to perform a wavelength sweep of emitted optical radiation which is greater than 5 nm;
an optical diverter coupled to the laser diode;
an optical fiber, including one or more sensors, coupled to the optical diverter; and an observation device configured to process back-reflected optical signals.

26. The optical system of claim 25, wherein an amplitude and pulse duration of the current pulse applied to the laser diode is sufficiently high to provide a peak increase in temperature of the active region of at least 40° C. at an end of a duration of the current pulse.

27. The optical system of claim 25, wherein an amplitude and pulse duration of the current pulse applied to the laser diode is sufficiently high to provide a peak increase in temperature of the active region of at least 50° C. at an end of a duration of the current pulse.

28. The optical system of claim 25, wherein an amplitude and pulse duration of the current pulse applied to the laser diode is sufficiently high to provide a peak increase in temperature of the active region of at least 70° C. at an end of a duration of the current pulse.

29. The optical system of claim 25 wherein the one or more sensors comprises a spectrally-resolved sensor.

30. The optical system of claim 25 wherein the observation device comprises a time-to-digital converter or an analog-to-digital converter.

31. The optical system of claim 25 wherein the optical diverter comprises 1×N optical coupler, circulator, or a dense wavelength division multiplexing combiner.

32. The optical system of claim 25 wherein the observation device comprises a collimating lens, a wavelength dispersive element, and a detector array.

33. The optical system of claim 25 wherein the observation device comprises a bandwidth that is below an inverse value of a duration of the current pulse.

* * * * *